United States Patent
Cho et al.

(10) Patent No.: US 12,200,866 B2
(45) Date of Patent: Jan. 14, 2025

(54) ELECTRONIC DEVICE INCLUDING ANTENNA

(71) Applicant: SAMSUNG ELECTRONICS CO., LTD., Suwon-si (KR)

(72) Inventors: Kyonghwan Cho, Suwon-si (KR); Jongmin Kim, Suwon-si (KR); Youngjung Kim, Suwon-si (KR); Sangho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 17/860,781

(22) Filed: Jul. 8, 2022

(65) Prior Publication Data

US 2023/0038214 A1    Feb. 9, 2023

Related U.S. Application Data

(63) Continuation of application No. PCT/KR2022/009624, filed on Jul. 4, 2022.

(30) Foreign Application Priority Data

Jul. 13, 2021   (KR) ..................... 10-2021-0091765

(51) Int. Cl.
*H01Q 1/24*    (2006.01)
*H01Q 1/38*    (2006.01)
(Continued)

(52) U.S. Cl.
CPC ............. *H05K 1/145* (2013.01); *H01Q 1/243* (2013.01); *H01Q 1/38* (2013.01); *H01R 12/721* (2013.01);
(Continued)

(58) Field of Classification Search
CPC ............ H01Q 1/24; H01Q 1/243; H01Q 1/38
See application file for complete search history.

(56) References Cited

U.S. PATENT DOCUMENTS 7,322,833 B1    1/2008  Hakansson et al.
7,572,128 B2    8/2009  Revelle, II
(Continued)

FOREIGN PATENT DOCUMENTS

CN    103972724 A  *  8/2014  ........... H01R 12/716
KR    10-2010-0037463 A    4/2010
(Continued)

OTHER PUBLICATIONS

International Search Report (PCT/ISA/210) and Written Opinion (PCT/ISA/237) dated Oct. 13, 2022 issued by the International Searching Authority in International Application No. PCT/KR2022/009624.

*Primary Examiner* — Hoang V Nguyen
(74) *Attorney, Agent, or Firm* — Sughrue Mion, PLLC

(57) ABSTRACT

An electronic device may include a printed circuit board including a connector configured to move between a first position and a second position on the printed circuit board; an antenna; a support member that is disposed between the printed circuit board and the antenna in a direction in which the printed circuit board, the support member, and the antenna are stacked; a signal connection member that is electrically connected to the connector of the printed circuit board; and a conductive member disposed between the printed circuit board and the support member, and aligned to cover the first position and the second position of the printed circuit board.

20 Claims, 23 Drawing Sheets

(51) Int. Cl.
   *H01R 12/72*   (2011.01)
   *H04M 1/02*   (2006.01)
   *H05K 1/14*   (2006.01)

(52) U.S. Cl.
   CPC ............... *H04M 1/0277* (2013.01); *H05K 2201/10189* (2013.01)

(56) References Cited

U.S. PATENT DOCUMENTS

| | | |
|---|---|---|
| 10,965,018 B2 | 3/2021 | Izawa |
| 2010/0081491 A1 | 4/2010 | Lee |
| 2010/0298027 A1 | 11/2010 | Yun |
| 2011/0148734 A1 | 6/2011 | An et al. |
| 2013/0162485 A1 | 6/2013 | Hobson et al. |
| 2015/0349406 A1 | 12/2015 | Jung et al. |
| 2020/0267861 A1 | 8/2020 | Kim |
| 2021/0167492 A1* | 6/2021 | Choe ............ H01Q 1/526 |
| 2021/0280961 A1 | 9/2021 | Kim et al. |

FOREIGN PATENT DOCUMENTS

| | | |
|---|---|---|
| KR | 10-2010-0125590 A | 12/2010 |
| KR | 10-1133405 B1 | 4/2012 |
| KR | 10-1138656 B1 | 4/2012 |
| KR | 10-2015-0033977 A | 4/2015 |
| KR | 10-1810175 B1 | 12/2017 |
| KR | 10-2020-0101791 A | 8/2020 |
| KR | 10-2152924 B1 | 9/2020 |
| KR | 10-2021-0068919 A | 6/2021 |
| KR | 10-2484484 B1 | 1/2023 |

* cited by examiner

ELECTRONIC DEVICE INCLUDING ANTENNA

CROSS-REFERENCE TO RELATED APPLICATION(S)

This application is a continuation application, claiming priority under § 365(c), of an International application No. PCT/KR2022/009624, filed on Jul. 4, 2022, which is based on and claims the benefit of a Korean patent application number 10-2021-0091765, filed on Jul. 13, 2021, in the Korean Intellectual Property Office, the disclosures of which are incorporated by reference herein in their entireties.

BACKGROUND

1. Field

Various embodiments of the disclosure relate to an electronic device including an antenna.

2. Description of the Related Art

The use of electronic devices such as portable devices of bar type, foldable type, rollable type, or sliding type is increasing, and a variety of functions is provided to such electronic devices.

An electronic device may transmit and receive a phone call and various data to and from any other electronic device through wireless communication.

In order to perform wireless communication with any other electronic device through a network, the electronic device may include at least one antenna.

SUMMARY

The electronic device may include a first printed circuit board and a second printed circuit board spaced apart from each other in consideration of a region in which a battery is disposed.

The first and second printed circuit boards spaced apart from each other may be electrically connected using a signal connection member (e.g., a coaxial cable).

For example, the signal connection member may be connected at a first end to a first connector (e.g., a plug) disposed on the first printed circuit board and connected at a second end to a second connector disposed on the second printed circuit board.

On the exterior of a rear case (e.g., a support member) that covers the first and second printed circuit boards, at least one antenna pattern (e.g., an antenna radiator) for performing wireless communication with other electronic devices may be disposed.

The at least one antenna pattern may be disposed to overlap with the first connector connected to the first end of the signal connection member and/or the second connector connected to the second end. In this case, the at least one antenna pattern may have a deviation occurring in the resonant frequency band, depending on a movement of the first connector connected to the first end of the signal connection member and/or a movement of the second connector connected to the second end.

In order to prevent a deviation from occurring in the resonant frequency band of the antenna due to the movement of the first and second connectors connected respectively to the first and second ends of the signal connection member, no antenna pattern may be disposed in regions overlapping with the first and second connectors. However, in this case, a usable area of the antenna pattern may be reduced, and the radiation performance of the antenna may be deteriorated.

If a deviation occurs in the resonant frequency band of the antenna or the performance is deteriorated, the electronic device may not be able to normally perform phone calls and/or data transmission/reception with other electronic devices.

Various embodiments of the disclosure may provide an electronic device that uses a conductive member disposed between the connector connected to the signal connection member and the antenna pattern and thereby can reduce the occurrence of a deviation in the resonant frequency band of the antenna or the deterioration of the radiation performance of the antenna while expanding the area of the antenna pattern.

The technical problems to be achieved in the disclosure are not limited to the above-mentioned problems, and other technical problems not mentioned are clearly understood from the following description by a person skilled in the art to which the disclosure belongs.

According to an aspect of the disclosure, an electronic device may include: a housing including a first support member, the first support member including a first surface and a second surface that are disposed to oppose each other; a display disposed on the first surface of the first support member; a first printed circuit board and a second printed circuit board disposed on the second surface of the first support member; a signal connection member including a first end and a second end that are electrically connected to a first connector of the first printed circuit board and to a second connector of the second printed circuit board, respectively; a second support member disposed on a rear surface of the first printed circuit board; a conductive member disposed on a first surface of the second support member at a position corresponding to at least a part of the first connector; and an antenna pattern disposed on a second surface of the second support member at a position corresponding to at least a part of the conductive member, wherein the first connector may be configured to move between a first position and a second position on the first printed circuit board, and the conductive member is disposed to cover the first position and the second position of the first printed circuit board, and a portion of the conductive member is disposed not to cover a non-moving portion of the first connector.

The first connector and the second connector may be made of a conductive material.

The second support member may be made of a non-conductive material.

The signal connection member may include a coaxial cable.

An extended portion of the antenna pattern may be disposed on the first surface of the second support member, and the conductive member may be disposed to be spaced apart from the extended portion of the antenna pattern.

The electronic device may further include: a non-conductive member disposed to cover the extended portion of the antenna pattern and the conductive member.

The non-conductive member may be disposed to press the first connector.

The first connector and the conductive member may be disposed to be spaced apart from each other.

The second connector may be configured to move between a third position and a fourth position on the second printed circuit board, and the electronic device further includes an additional conductive member disposed to cover the third position and the fourth position of the second printed circuit board.

A portion of the additional conductive member may be disposed not to cover a non-moving portion of the second connector.

According to another aspect of the disclosure, an electronic device may include: a housing including a first support member, the first support member including a first surface and a second surface that are disposed to oppose each other; a display disposed on the first surface of the first support member; a first printed circuit board and a second printed circuit board disposed on the second surface of the first support member; a first signal connection member including a first end and a second end that are electrically connected to a first connector of the first printed circuit board and to a second connector of the second printed circuit board, respectively; a second signal connection member including a third end and a fourth end that are electrically connected to a third connector of the first printed circuit board and to a fourth connector of the second printed circuit board, respectively; a second support member disposed on a rear surface of the first printed circuit board or the second printed circuit board; a first conductive member disposed on a first surface of the second support member at a position corresponding to at least a part of the first connector, and a second conductive member disposed on the first surface of the second support member at a position corresponding to at least a part of the third connector; and a first antenna pattern disposed on a second surface of the second support member at a position corresponding to at least in part of the first conductive member and the second conductive member.

The first connector, the second connector, the third connector, and the fourth connector may be made of a conductive material, and the second support member may be made of a non-conductive material.

Each of the first signal connection member and the second signal connection member may include a coaxial cable.

The electronic device may further include: a third conductive member disposed on the first surface of the second support member at a position corresponding to at least a part of the second connector.

The electronic device may further include: a second antenna pattern disposed on the second surface of the second support member at a position corresponding to at least part of the third conductive member.

The first connector is configured to move between a first position and a second position on the first printed circuit board, and the first conductive member is disposed to cover the first position and the second position of the first printed circuit board, the second connector is configured to move between a third position and a fourth position on the second printed circuit board, and the second conductive member is disposed to cover the third position and the fourth position of the second printed circuit board, and the first conductive member and the second conductive member are disposed to be spaced apart from each other.

The second connector is configured to move between a fifth position and a sixth position on the second printed circuit board, and the third conductive member is disposed to cover the fifth position and the sixth position of the second printed circuit board.

The electronic device may further include: a third signal connection member including a first end and a second end that are electrically connected to a fifth connector disposed on the first printed circuit board and to a sixth connector disposed on the second printed circuit board, respectively.

The electronic device may further include: a fourth conductive member disposed on the first surface of the second support member at a position corresponding to at least a part of the fifth connector, wherein the fifth connector may be configured to move between a seventh position and an eighth position on the first printed circuit board, and the fourth conductive member is disposed to cover the seventh position and the eighth position of the first printed circuit board.

According to another aspect of the disclosure, an electronic device may include a printed circuit board including a connector configured to move between a first position and a second position on the printed circuit board; an antenna; a support member that is disposed between the printed circuit board and the antenna in a direction in which the printed circuit board, the support member, and the antenna are stacked; a signal connection member that is electrically connected to the connector of the printed circuit board; and a conductive member disposed between the printed circuit board and the support member, and aligned to cover the first position and the second position of the printed circuit board.

According to various embodiments of the disclosure, the conductive member (e.g., a floating ground) is disposed between the antenna pattern (e.g., an antenna radiator) and the connector (e.g., a conductive ground) connected to the signal connection member (e.g., a coaxial cable), so that it is possible to enlarge the area of the antenna pattern, reduce the occurrence of deviation in the resonant frequency band of the antenna, and reduce the degradation of the radiation performance of the antenna.

In addition, various effects explicitly or implicitly appreciated through the disclosure may be provided.

BRIEF DESCRIPTION OF THE DRAWINGS

The above and/or other aspects will be more apparent by describing certain example embodiments, with reference to the accompanying drawings, in which.

Figure 6:
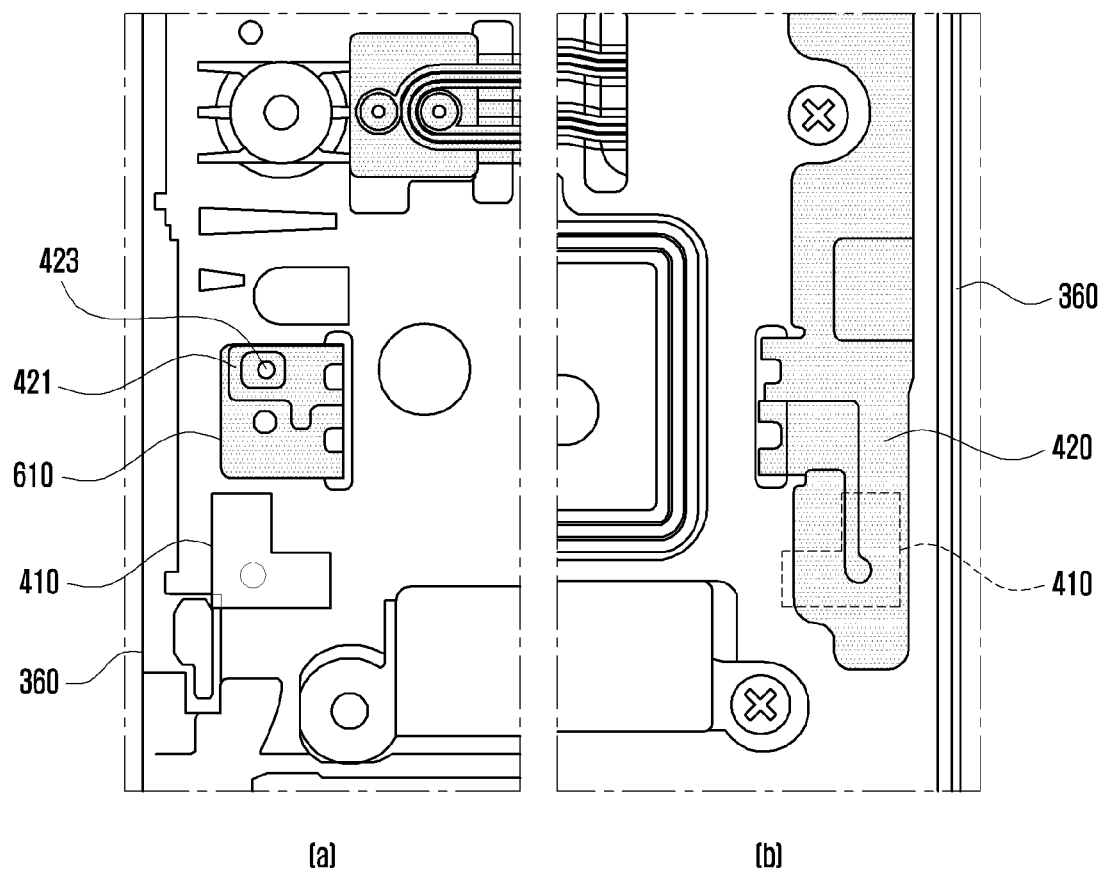

Part (a) of FIG. 6 is a diagram illustrating a portion of a first surface of a second support member of an electronic device according to various embodiments of the disclosure.

Part (b) of FIG. 6 is a diagram illustrating a portion of a second surface of a second support member of an electronic device according to various embodiments of the disclosure.

Figure 7:
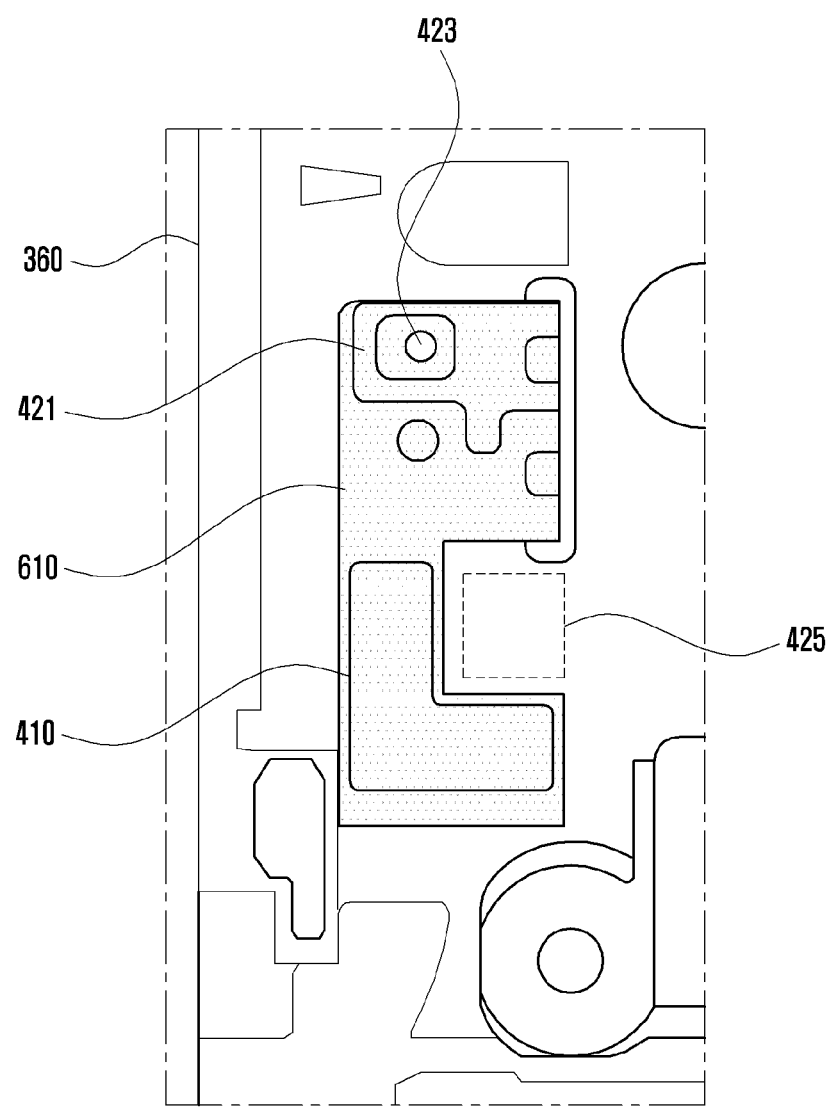

FIG. 7 is a diagram illustrating a portion of a first surface of a second support member of an electronic device according to various embodiments of the disclosure.

Figure 8:
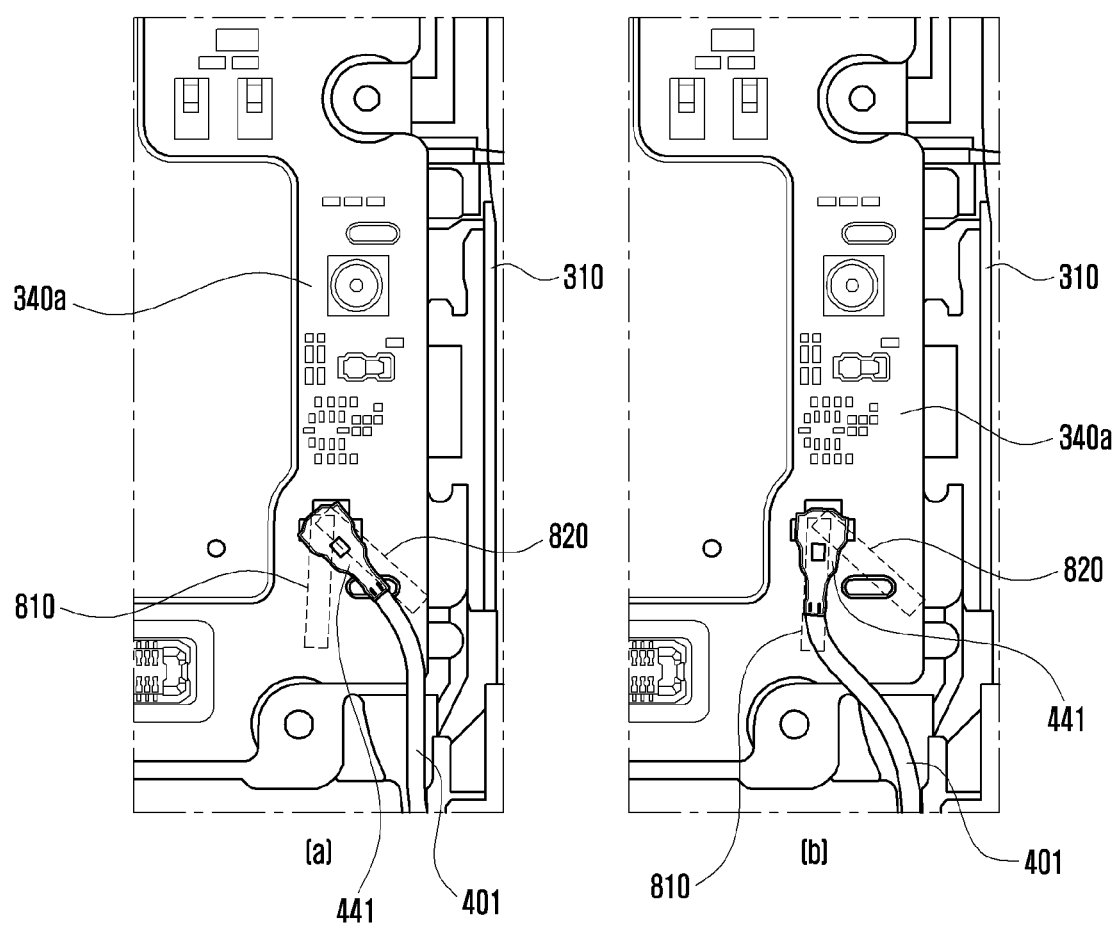

Parts (a) and (b) of FIG. 8 are diagrams illustrating the movement of a first signal connection member disposed on a first PCB of an electronic device according to various embodiments of the disclosure.

Figure 9:
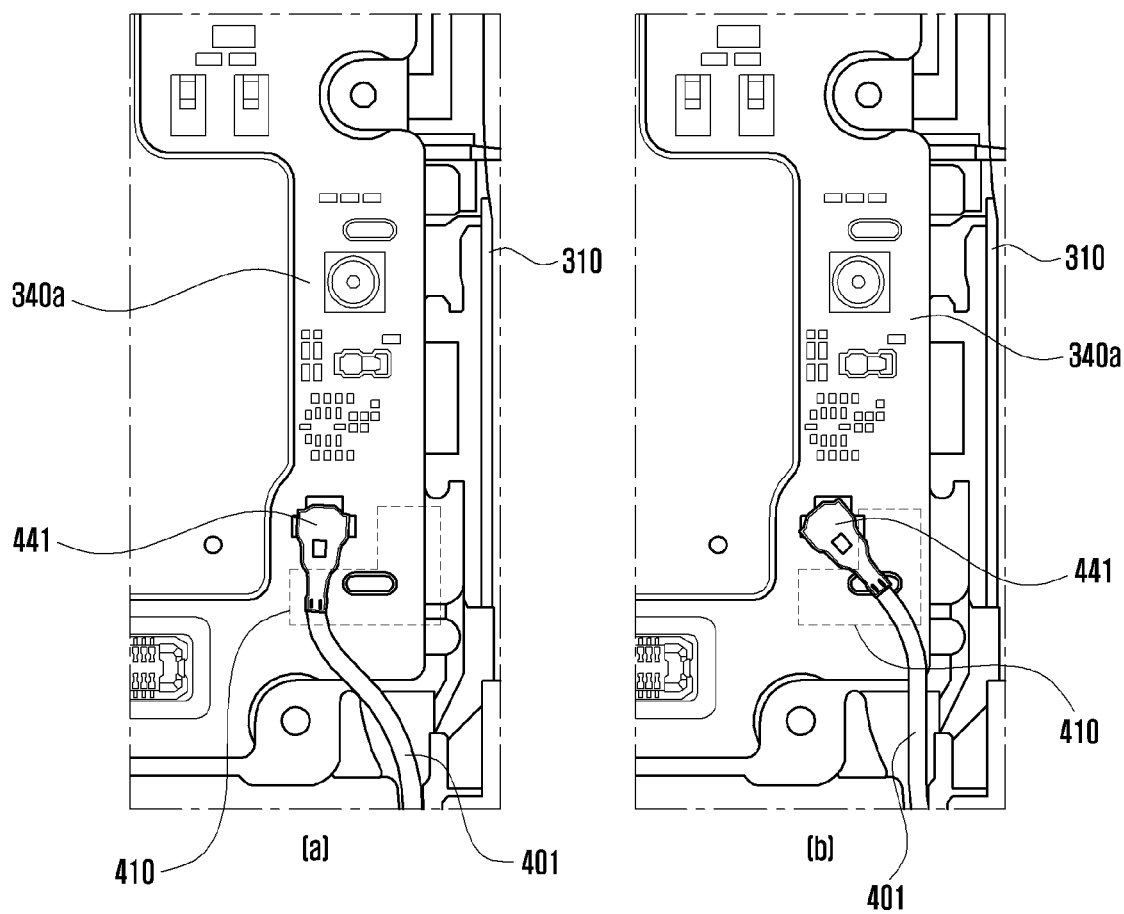

Parts (a) and (b) of FIG. 9 are diagrams illustrating a conductive member disposed at a position corresponding to a first connector of an electronic device according to various embodiments of the disclosure.

Figure 10:
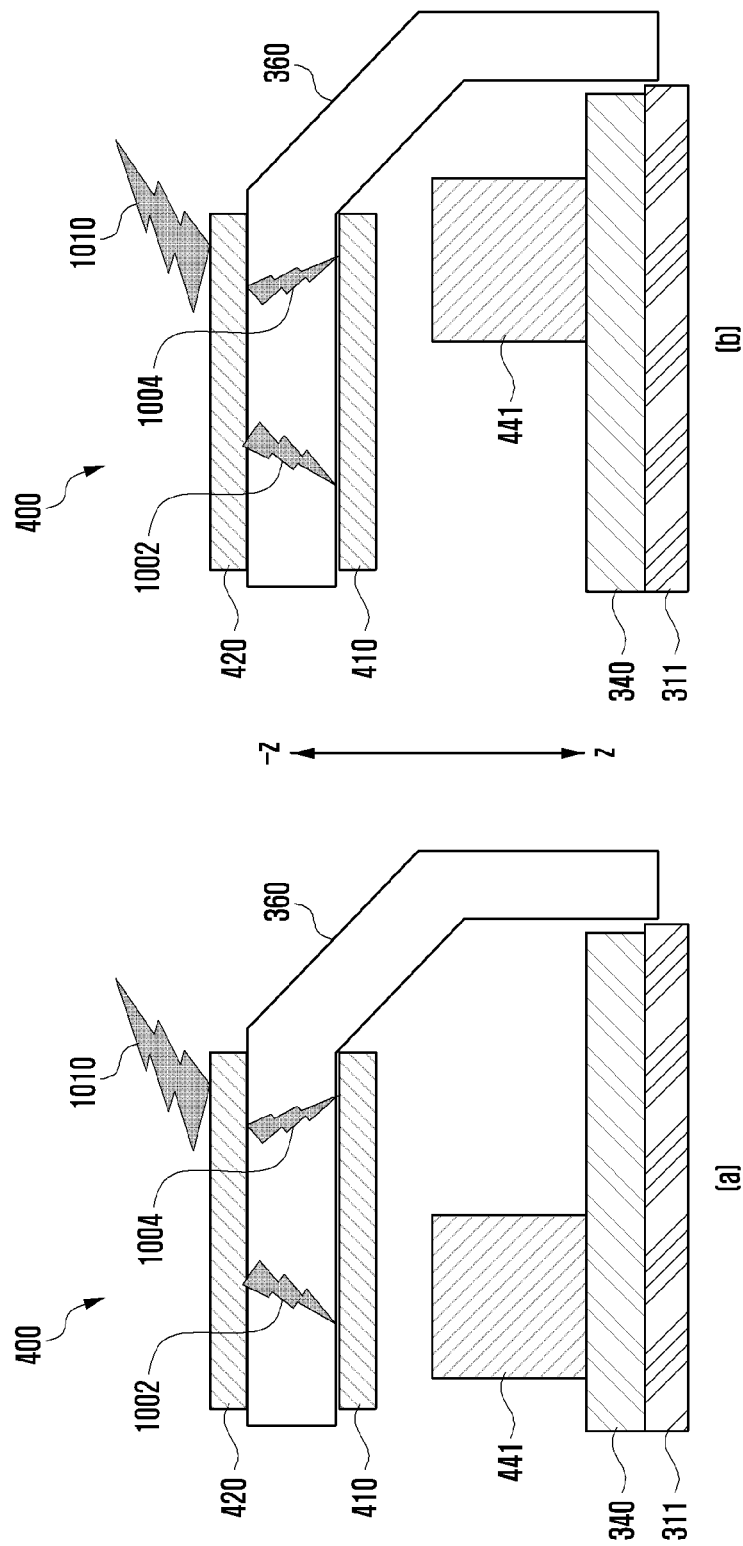

Parts (a) and (b) of FIG. 10 are diagrams schematically illustrating a configuration in which a conductive member of an electronic device is disposed between a first connector and an antenna pattern according to various embodiments of the disclosure.

Figure 11:
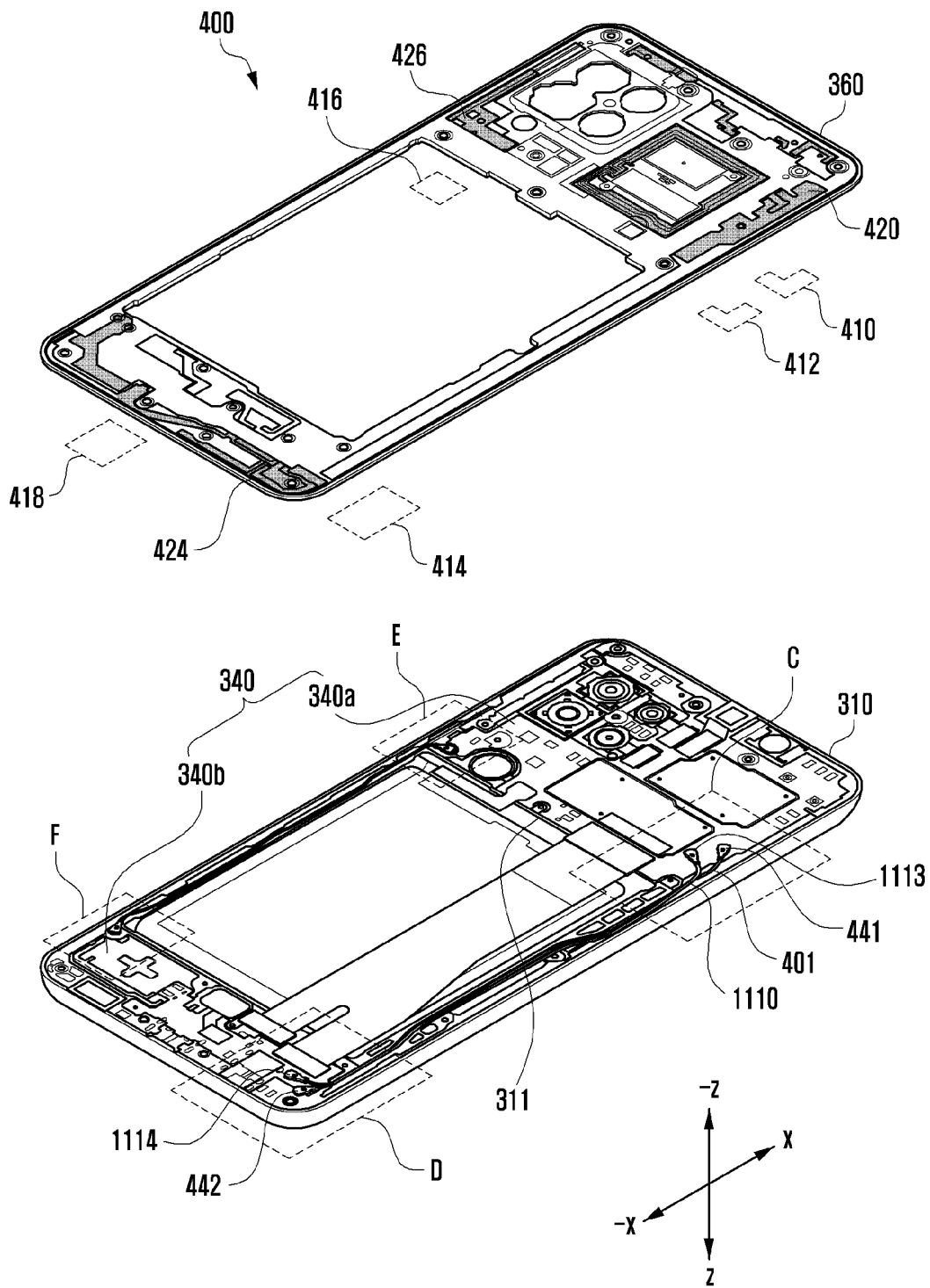

FIG. 11 is an exploded perspective view schematically illustrating a portion of an electronic device according to various embodiments of the disclosure.

Figure 12:
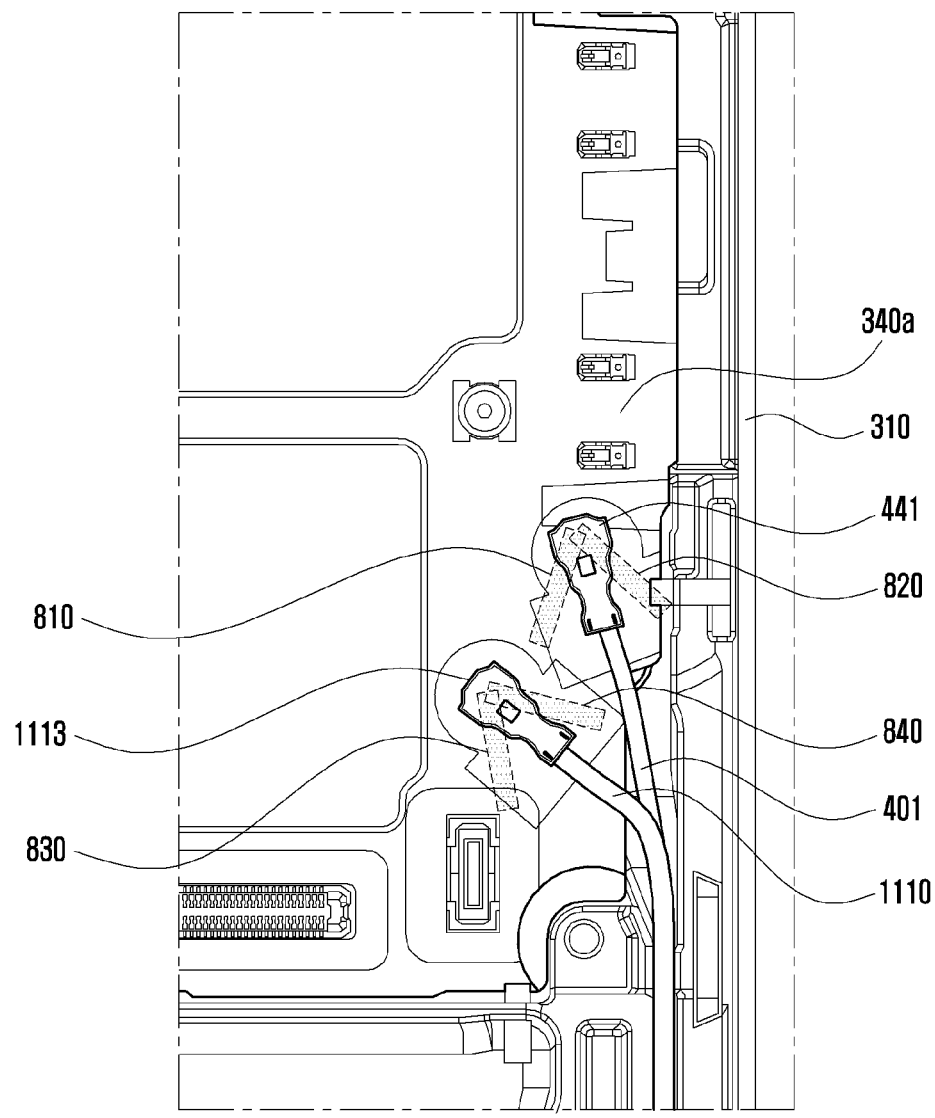

FIG. 12 is a diagram illustrating the movement of first and second signal connection members disposed on a first PCB of an electronic device according to various embodiments of the disclosure.

Figure 13:
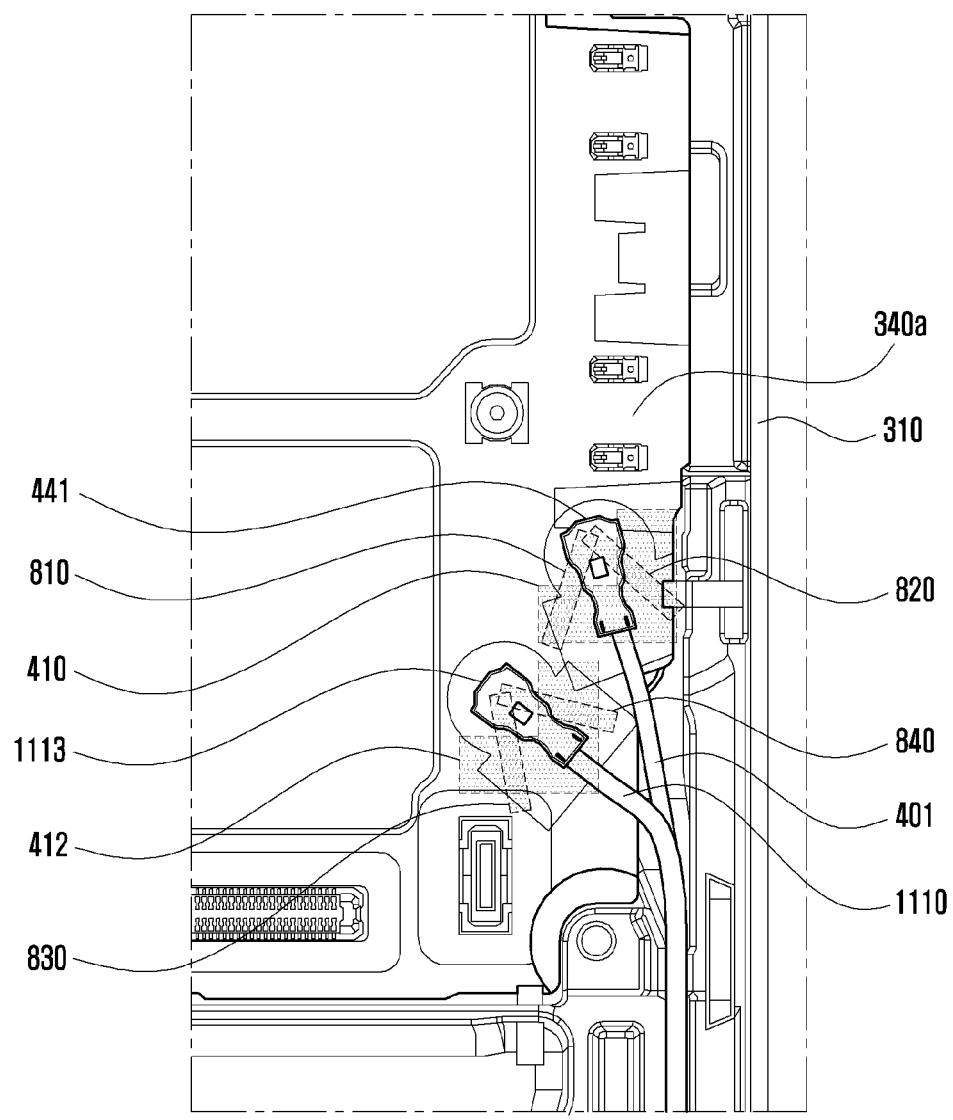

FIG. 13 is a diagram illustrating first and second conductive members disposed respectively at positions corresponding to first and third connectors of an electronic device according to various embodiments of the disclosure.

Figure 14:
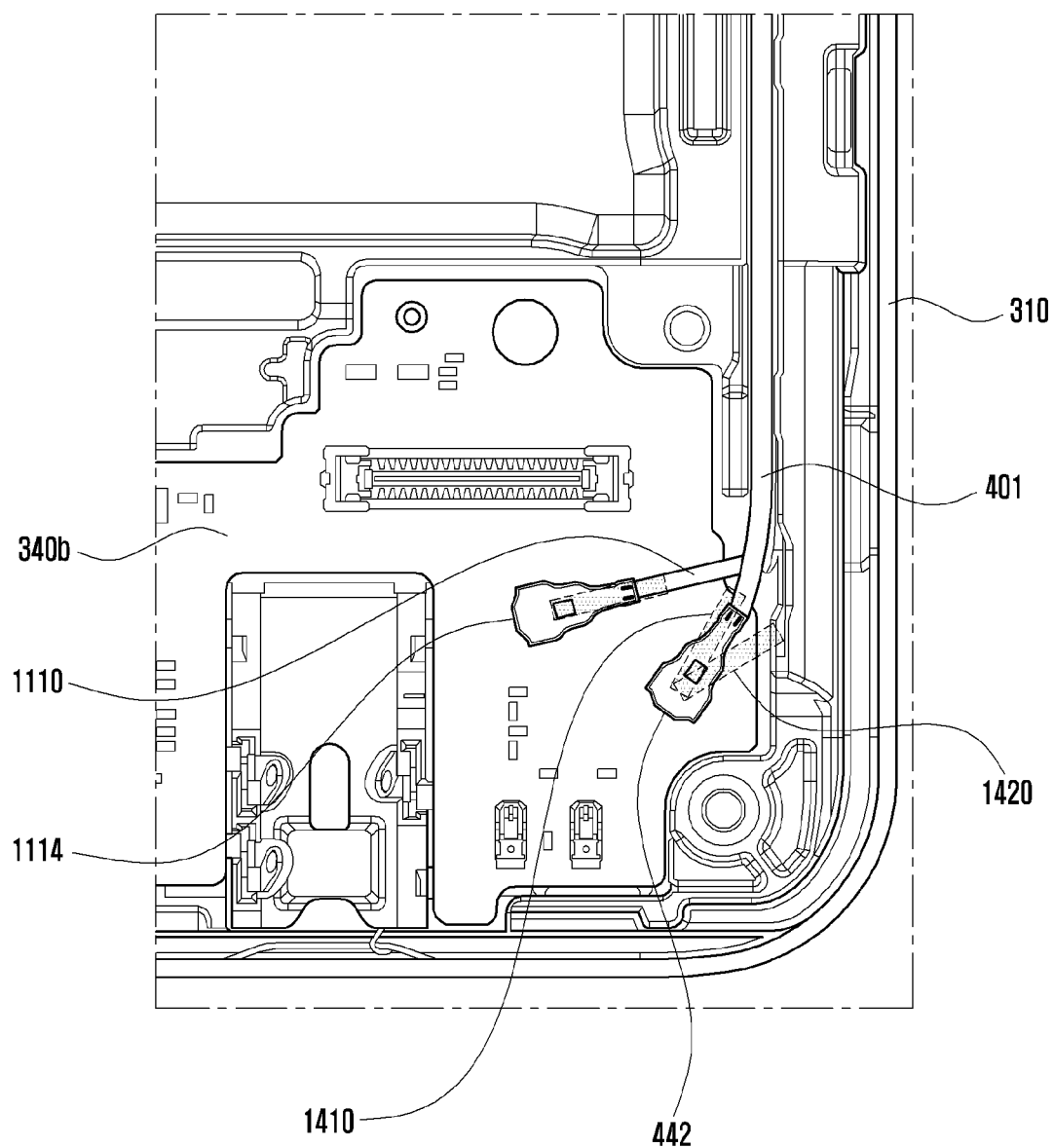

FIG. 14 is a diagram illustrating the movement of first and second signal connection members disposed on a second PCB of an electronic device according to various embodiments of the disclosure.

Figure 15:
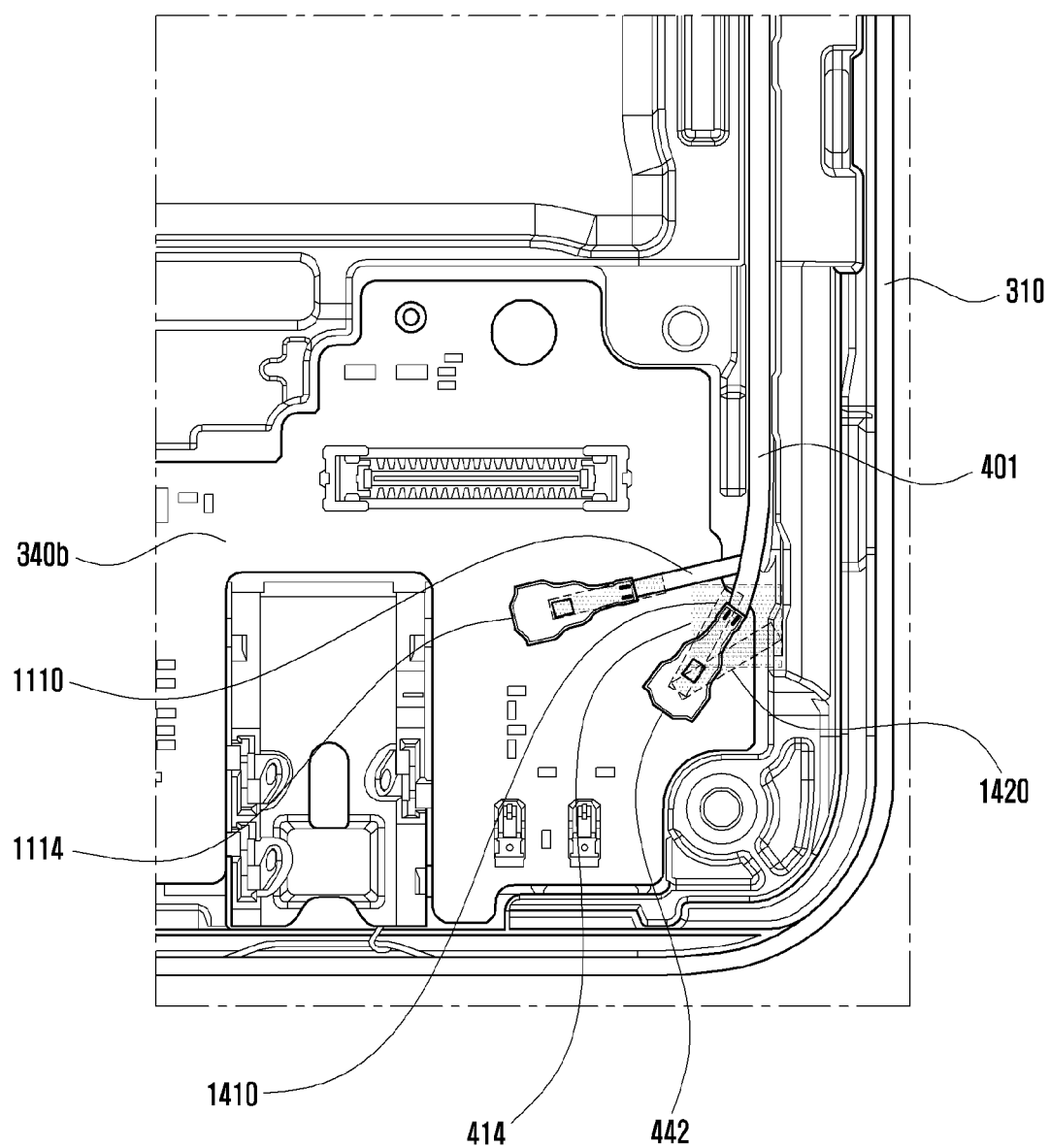

FIG. 15 is a diagram illustrating a third conductive member disposed at a position corresponding to a second connector of an electronic device according to various embodiments of the disclosure.

Figure 16:
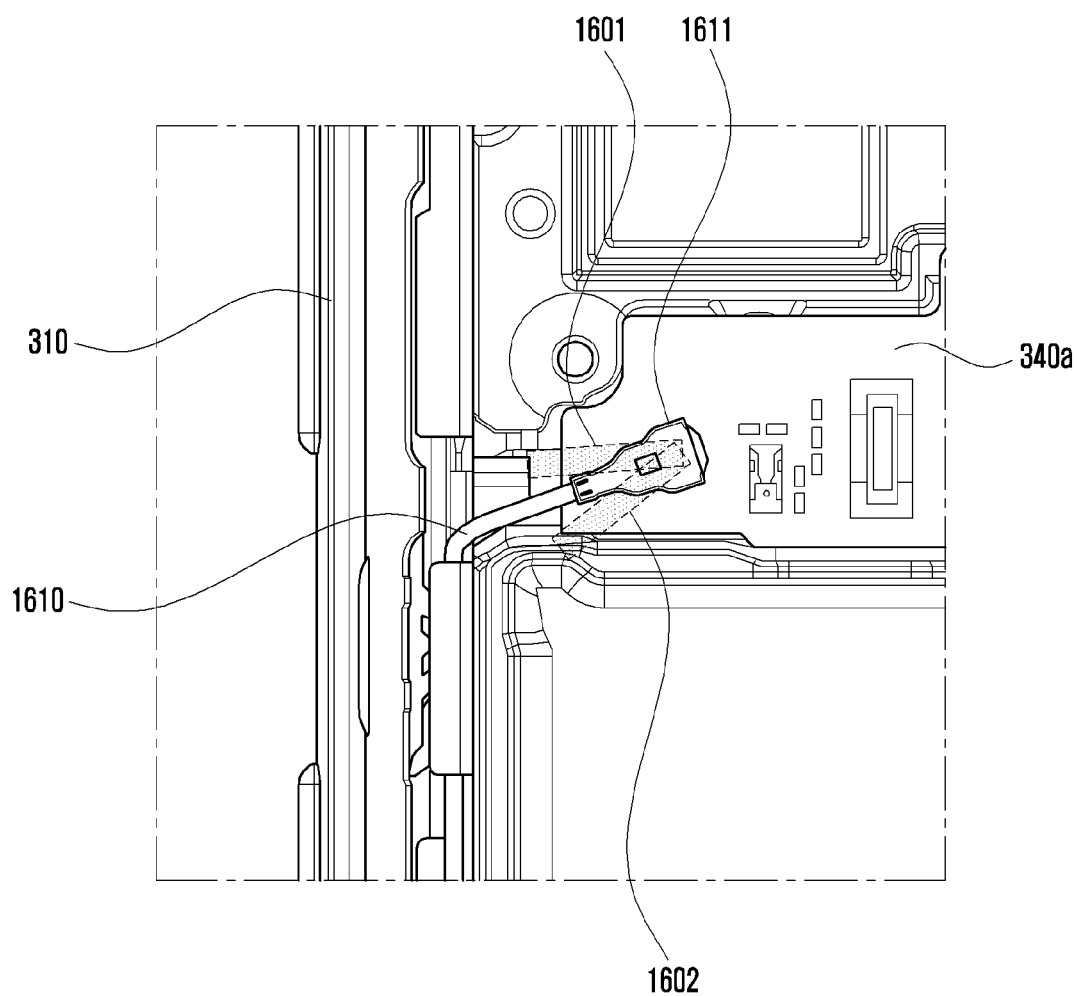

FIG. 16 is a diagram illustrating the movement of a third signal connection member disposed on a first PCB of an electronic device according to various embodiments of the disclosure.

Figure 17:
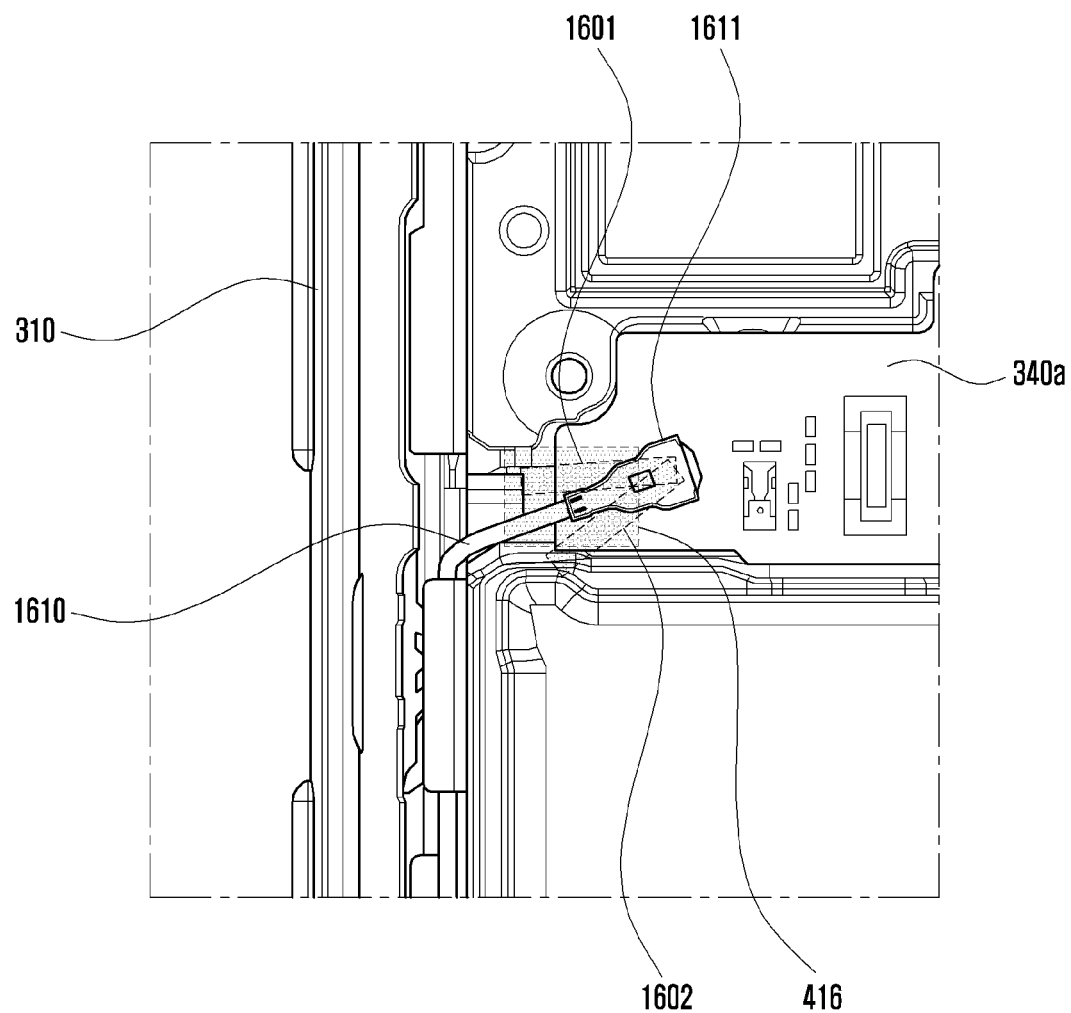

FIG. 17 is a diagram illustrating a fourth conductive member disposed at a position corresponding to a fifth connector of an electronic device according to various embodiments of the disclosure.

Figure 18:
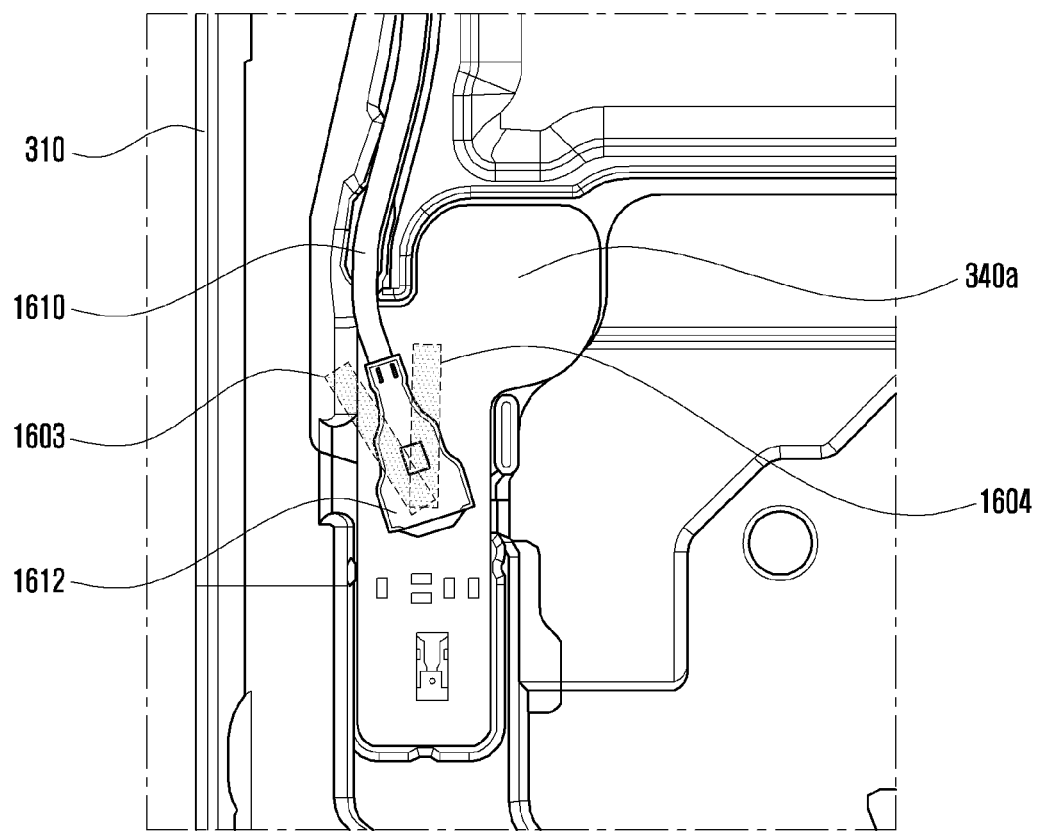

FIG. 18 is a diagram illustrating the movement of a third signal connection member disposed on a second PCB of an electronic device according to various embodiments of the disclosure.

Figure 19:
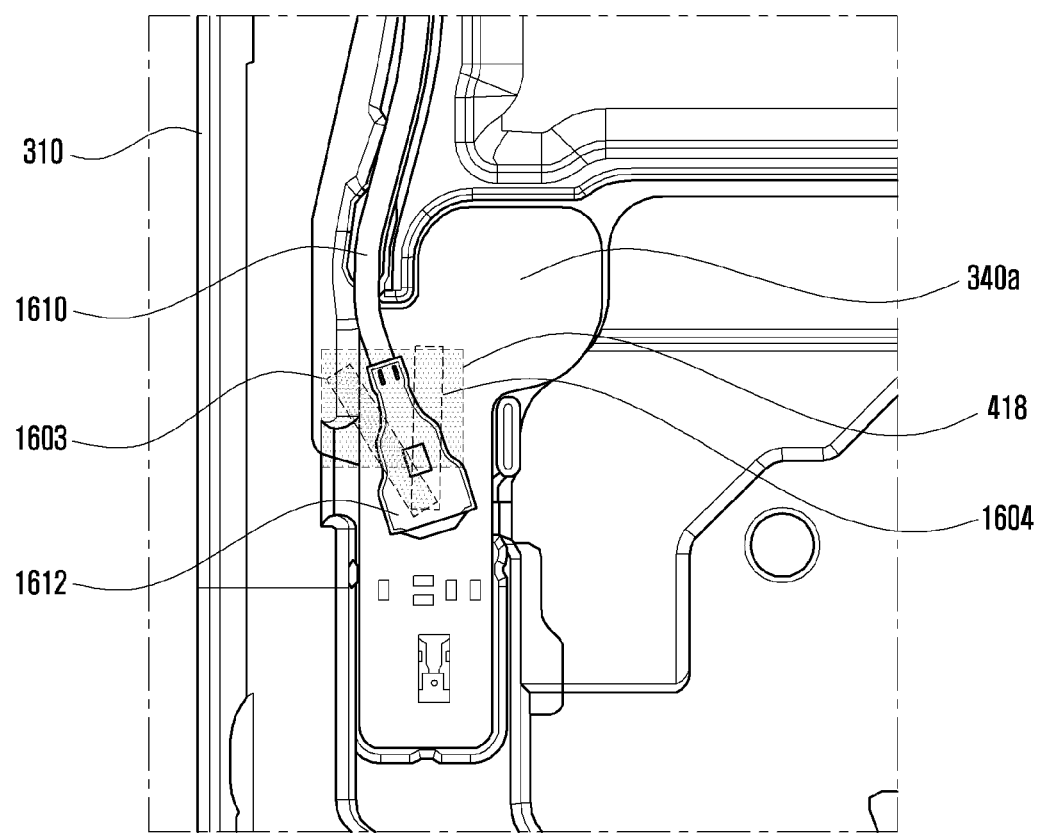

FIG. 19 is a diagram illustrating a fifth conductive member disposed at a position corresponding to a sixth connector of an electronic device according to various embodiments of the disclosure.

Figure 20:
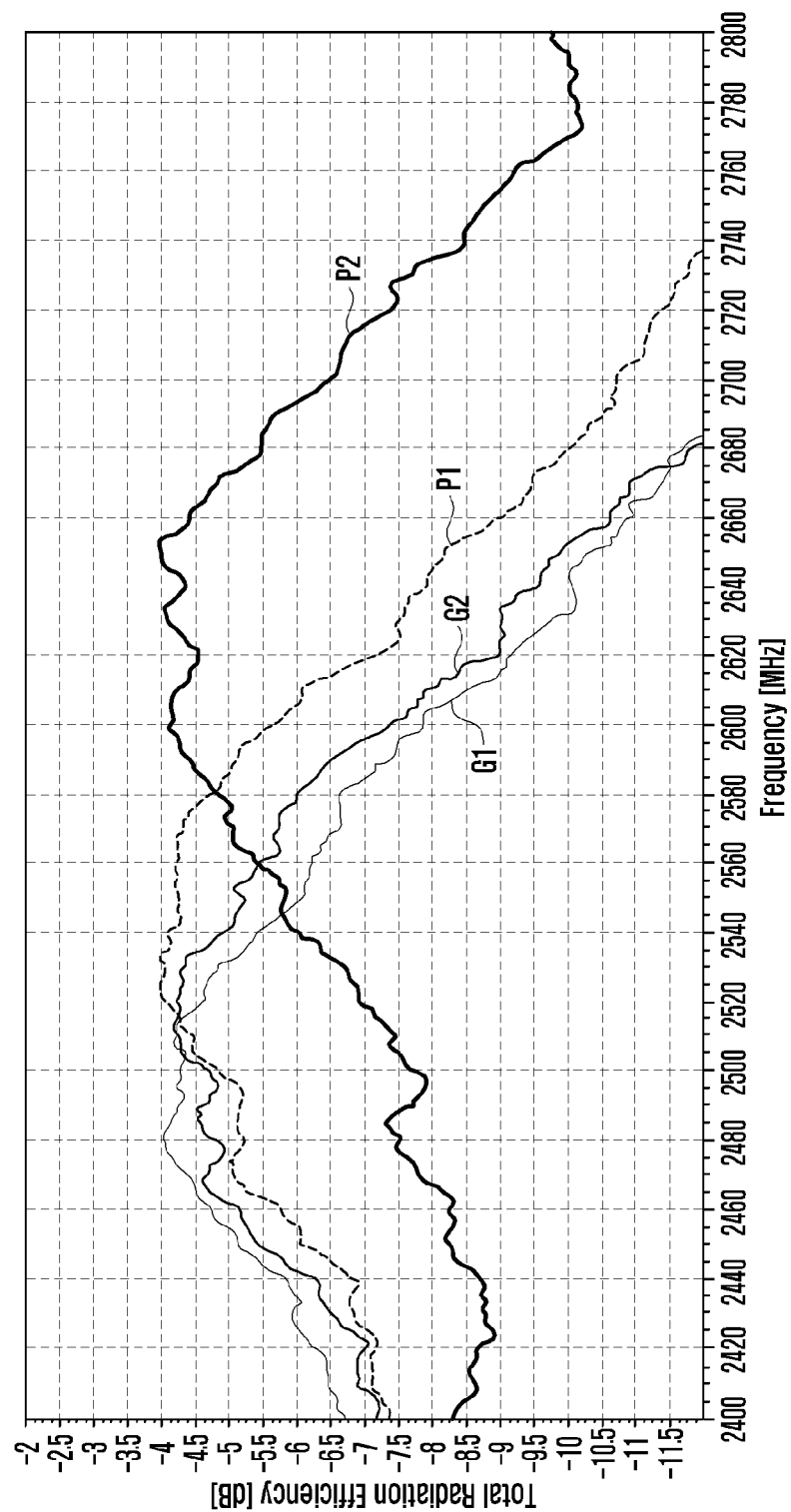

FIG. 20 is a diagram illustrating the antenna resonance of an electronic device according to a comparative embodiment and the antenna resonance of an electronic device according to various embodiments of the disclosure.

Figure 21:
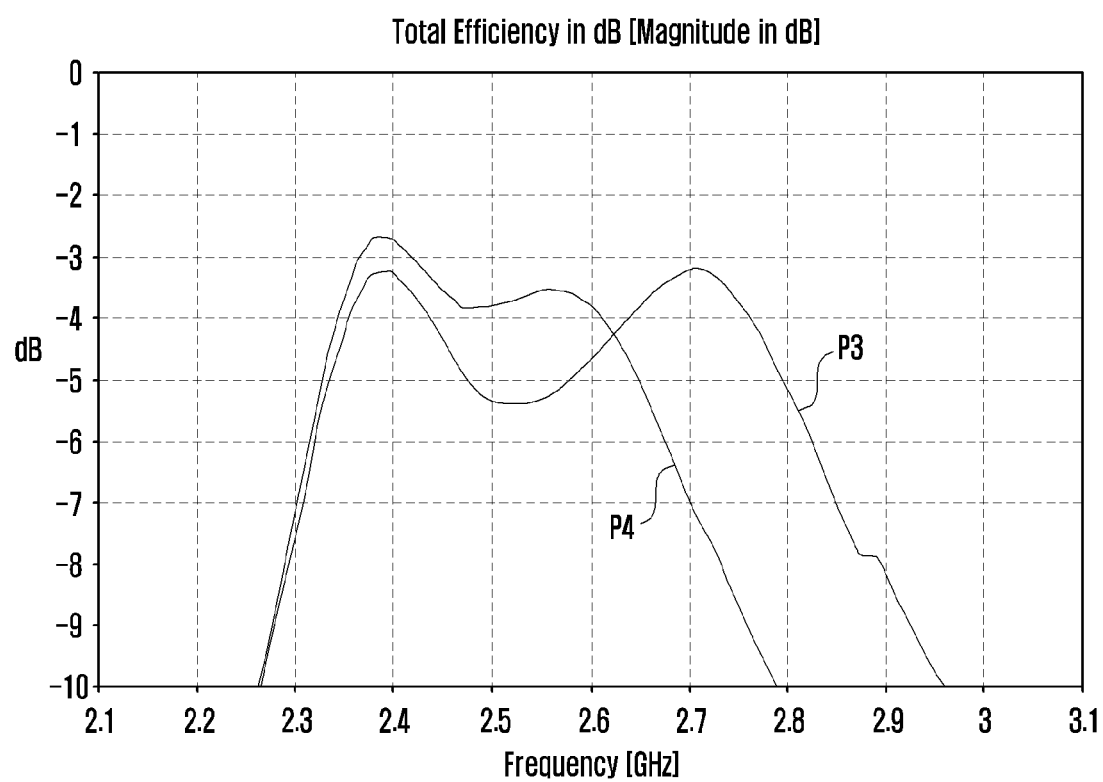

FIG. 21 is a diagram illustrating the antenna performance deviation of an electronic device according to a comparative embodiment.

Figure 22:
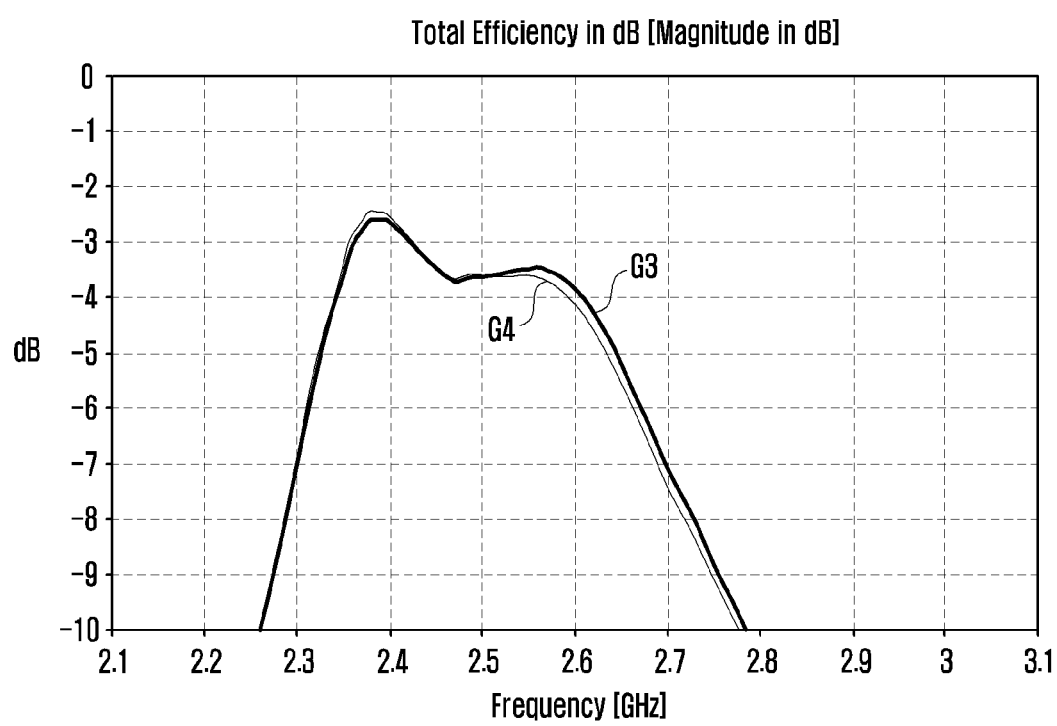

FIG. 22 is a diagram illustrating the antenna performance deviation of an electronic device according to various embodiments of the disclosure.

DETAILED DESCRIPTION

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

While such terms as "first," "second," etc., may be used to describe various elements, such elements must not be limited to the above terms. The above terms may be used only to distinguish one element from another.

Figure 1:
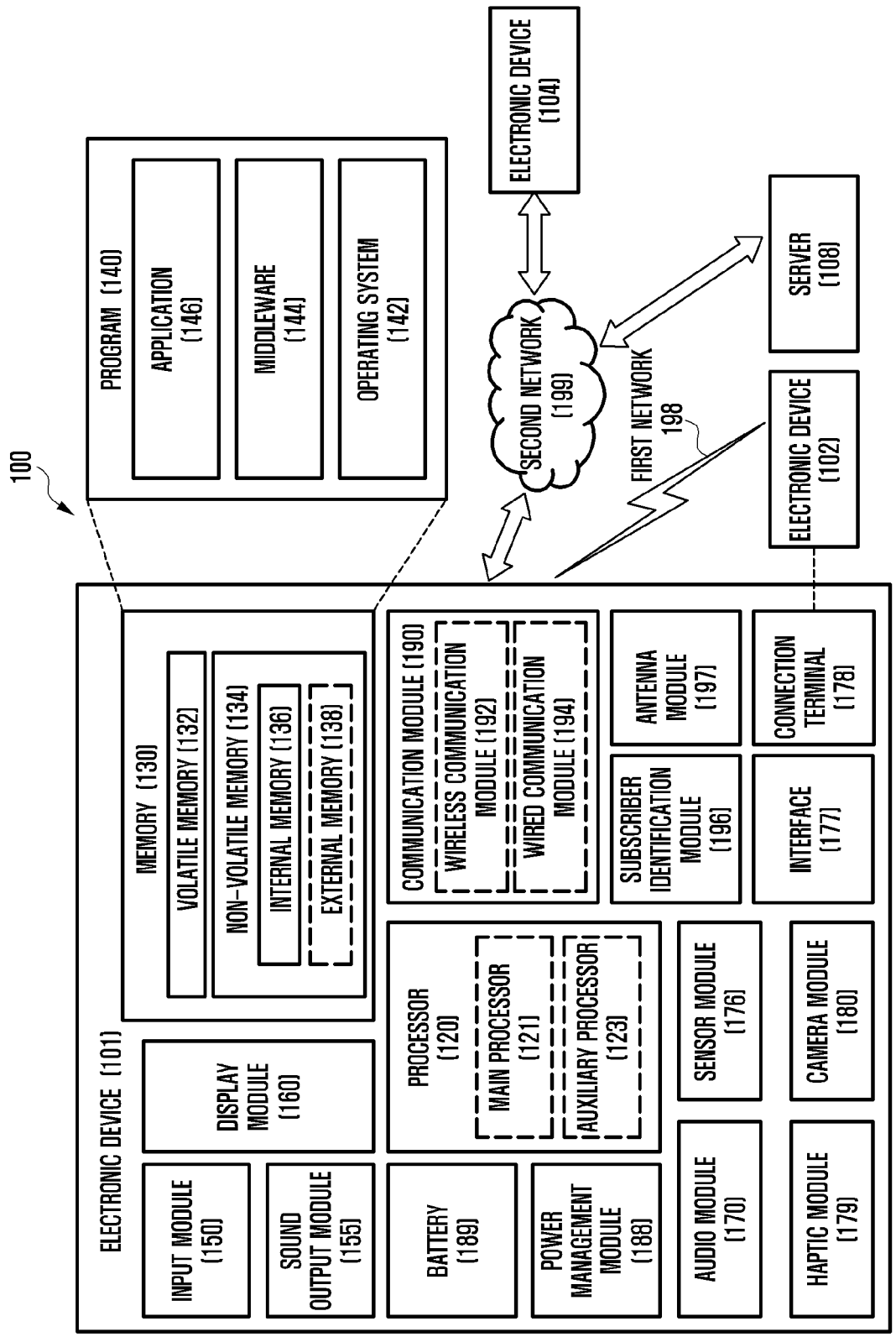
FIG. 1 is a block diagram illustrating an electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Figure 2A:
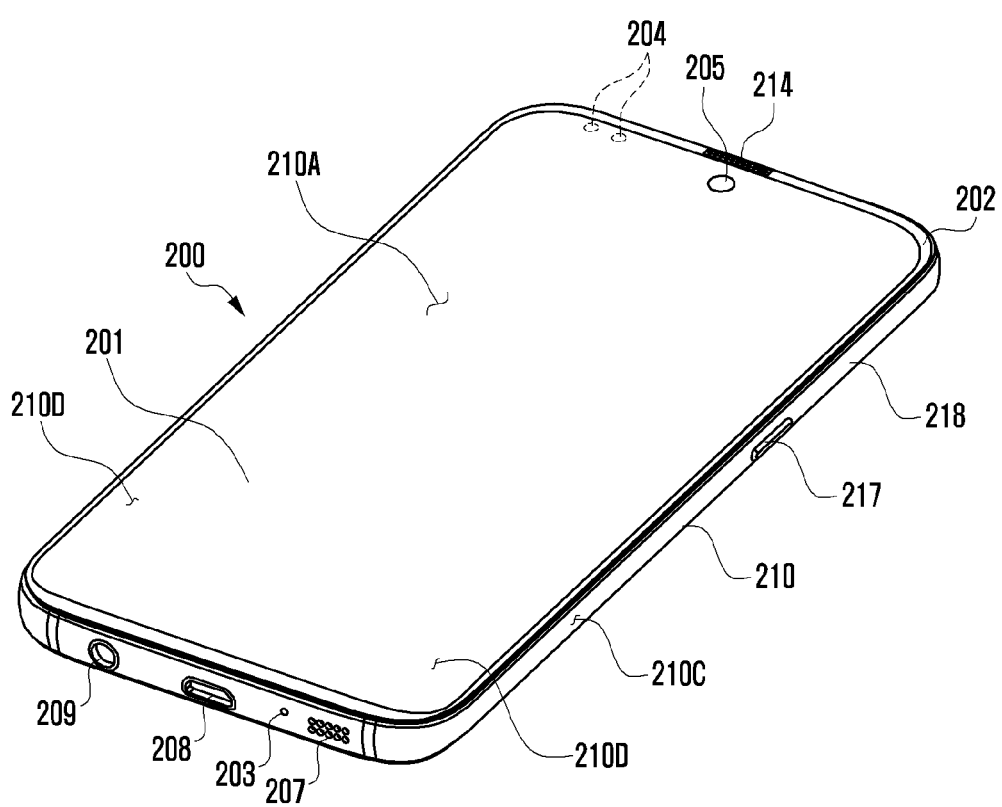
FIG. 2A is a front perspective view illustrating an electronic device according to various embodiments of the disclosure.
Figure 2B:
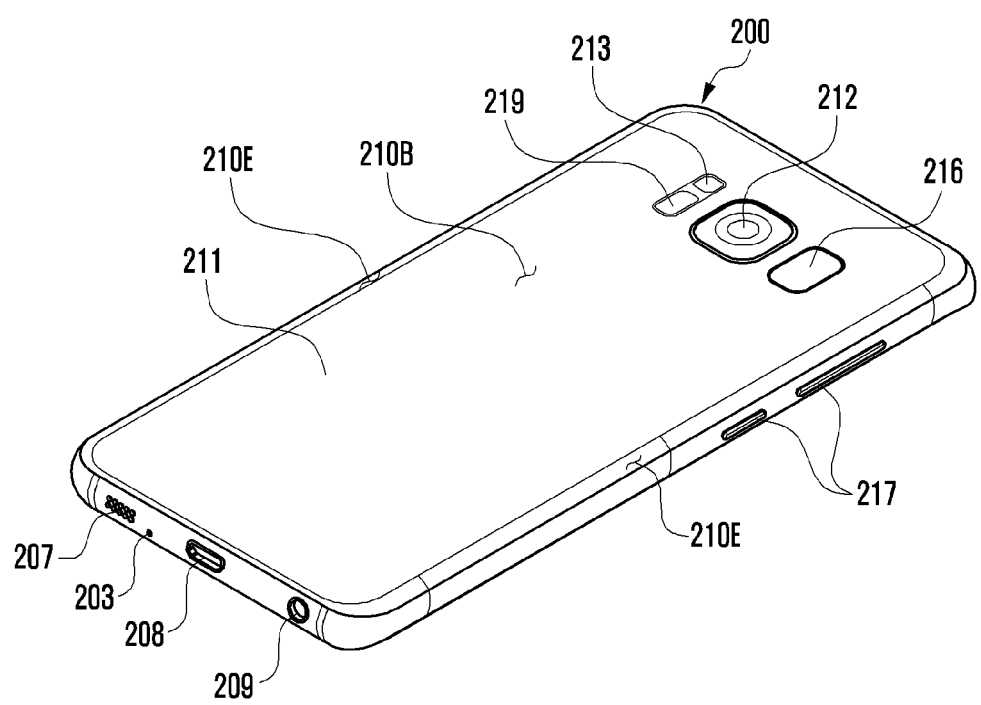
FIG. 2B is a rear perspective view illustrating an electronic device according to various embodiments of the disclosure.

FIG. 2A is a front perspective view illustrating an electronic device according to various embodiments of the disclosure. FIG. 2B is a rear perspective view illustrating an electronic device according to various embodiments of the disclosure.

Referring to FIG. 2A and FIG. 2B, an electronic device 200 according to an embodiment may include a housing 210 including a first surface (or front surface) 210A, a second surface (or rear surface) 210B, and a side surface 210C surrounding the space between the first surface 210A and the second surface 210B. In another embodiment (not illustrated), the housing may denote a structure that forms a part of the first surface 210A, the second surface 210B, and the side surface 210C illustrated in FIG. 2A and FIG. 2B. According to an embodiment, the first surface 210A may be formed by a front plate 202, at least a part of which is substantially transparent (for example, a glass plate including various coating layers, or a polymer plate). The second surface 210B may be formed by a rear plate 211 that is substantially opaque. The rear plate 211 may be made of coated or colored glass, ceramic, polymer, metal (for example, aluminum, stainless steel (STS), or magnesium), or a combination of at least two of the above-mentioned materials. The side surface 210C may be formed by a side bezel structure (or "side member") 218 which is coupled to the front plate 202 and to the rear plate 211, and which includes metal and/or polymer. In some embodiments, the rear plate 211 and the side bezel structure 218 may be formed integrally and may include the same material (for example, a metal material such as aluminum).

In the illustrated embodiment, the front plate 202 may include two first areas 210D on both ends of the long edge of the front plate 202 such that the two first areas 210D bend from the first surface 210A toward the rear plate 211 and extend seamlessly. In the illustrated embodiment (see FIG. 2B), the rear plate 211 may include two second areas 210E on both ends of the long edge such that the two second areas 210E bend from the second surface 210B toward the front plate 202 and extend seamlessly. In some embodiments, the front plate 202 (or the rear plate 211) may include only one of the first areas 210D (or the second areas 210E). In another embodiment, a part of the first areas 210D or the second areas 210E may not be included. In the above embodiments, when seen from the side surface of the electronic device 200, the side bezel structure 218 may have a first thickness (or width) on a part of the side surface, which does not include the first areas 210D or the second areas 210E as described above, and may have a second thickness that is smaller than the first thickness on a part of the side surface, which includes the first areas 210D or the second areas 210E.

According to an embodiment, the electronic device 200 may include at least one of a display 201, audio modules 203, 207, and 214, sensor modules 204, 216, and 219, camera modules 205, 212, and 313, a key input device 217, a light-emitting element 206, and connector holes 208 and 209. In some embodiments, at least one of the constituent elements (for example, the key input device 217 or the light-emitting element 206) of the electronic device 200 may be omitted, or the electronic device 200 may additionally include another constituent element.

The display 201 may be exposed through a corresponding part of the front plate 202, for example. In some embodiments, at least a part of the display 201 may be exposed through the front plate 202 that forms the first areas 210D of the side surface 210C and the first surface 210A. In some embodiments, the display 201 may have a corner formed in substantially the same shape as that of the adjacent outer periphery of the front plate 202. In another embodiment (not illustrated), in order to increase the area of exposure of the display 201, the interval between the outer periphery of the display 201 and the outer periphery of the front plate 202 may be formed to be substantially identical.

The audio modules 203, 207, and 214 may include a microphone hole 203 and speaker holes 207 and 214. A microphone for acquiring an external sound may be arranged in the microphone hole 203, and a plurality of microphones may be arranged therein such that the direction of a sound can be sensed in some embodiments. The speaker holes 207 and 214 may include an outer speaker hole 207 and a speech receiver hole 214. In some embodiments, the speaker holes 207 and 214 and the microphone hole 203 may be implemented as a single hole, or a speaker may be included (for example, a piezoelectric speaker) without the speaker holes 207 and 214.

The sensor modules 204, 216, and 219 may generate an electric signal or a data value corresponding to the internal operating condition of the electronic device 200 or the external environment condition thereof. The sensor modules 204, 216, and 219 may include, for example, a first sensor module 204 (for example, a proximity sensor) arranged on the first surface 210A of the housing 210, and/or a second sensor module (not illustrated) (for example, a fingerprint sensor), and/or a third sensor module 219 (for example, an HRM sensor) arranged on the second surface 210B of the housing 210, and/or a fourth sensor module 216 (for example, a fingerprint sensor). The fingerprint sensor may be arranged not only on the first surface 210A (for example, the display 201) of the housing 210, but also on the second surface 210B thereof. The electronic device 200 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 204.

The camera modules 205, 212, and 213 may include a first camera device 205 arranged on the first surface 210A of the electronic device 200, a second camera device 212 arranged on the second surface 210B thereof, and/or a flash 213. The camera devices 205 and 212 may include a single lens or a plurality of lenses, an image sensor, and/or an image signal processor. The flash 213 may include, for example, a light-emitting diode or a xenon lamp. In some embodiments, two or more lenses (an infrared camera, a wide-angle lens, and a telephoto lens) and image sensors may be arranged on a single surface of the electronic device 200.

The key input device 217 may be arranged on the side surface 210C of the housing 210. In another embodiment, the electronic device 200 may not include a part of the above-mentioned key input device 217 or the entire key input device 217, and the key input device 217 (not included) may be implemented in another type, such as a soft key, on the display 201. In some embodiments, the key input device may include a sensor module 216 arranged on the second surface 210B of the housing 210.

The connector holes 208 and 209 may include a first connector hole 208 capable of containing a connector (for example, a USB connector) for transmitting/receiving power and/or data to/from an external electronic device, and/or a second connector hole (for example, an earphone jack) 209 capable of containing a connector for transmitting/receiving an audio signal to/from the external electronic device.

In another embodiment (not illustrated), a recess or an opening may be formed in a part of the screen display area of the display 201, and at least one of an audio module 214, a sensor module 204, a camera module 205, and a light-emitting element 206 may be included and aligned with the recess or the opening. In another embodiment (not illustrated), on the back surface of the screen display area of the display 201, at least one of an audio module 214, a sensor module 204, a camera module 205, a fingerprint sensor 216, and a light-emitting element 206 may be included. In another embodiment (not illustrated), the display 201 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 204 and 219 and/or at least a part of the key input device 217 may be arranged in the first areas 210D and/or the second areas 210E.

Figure 3:
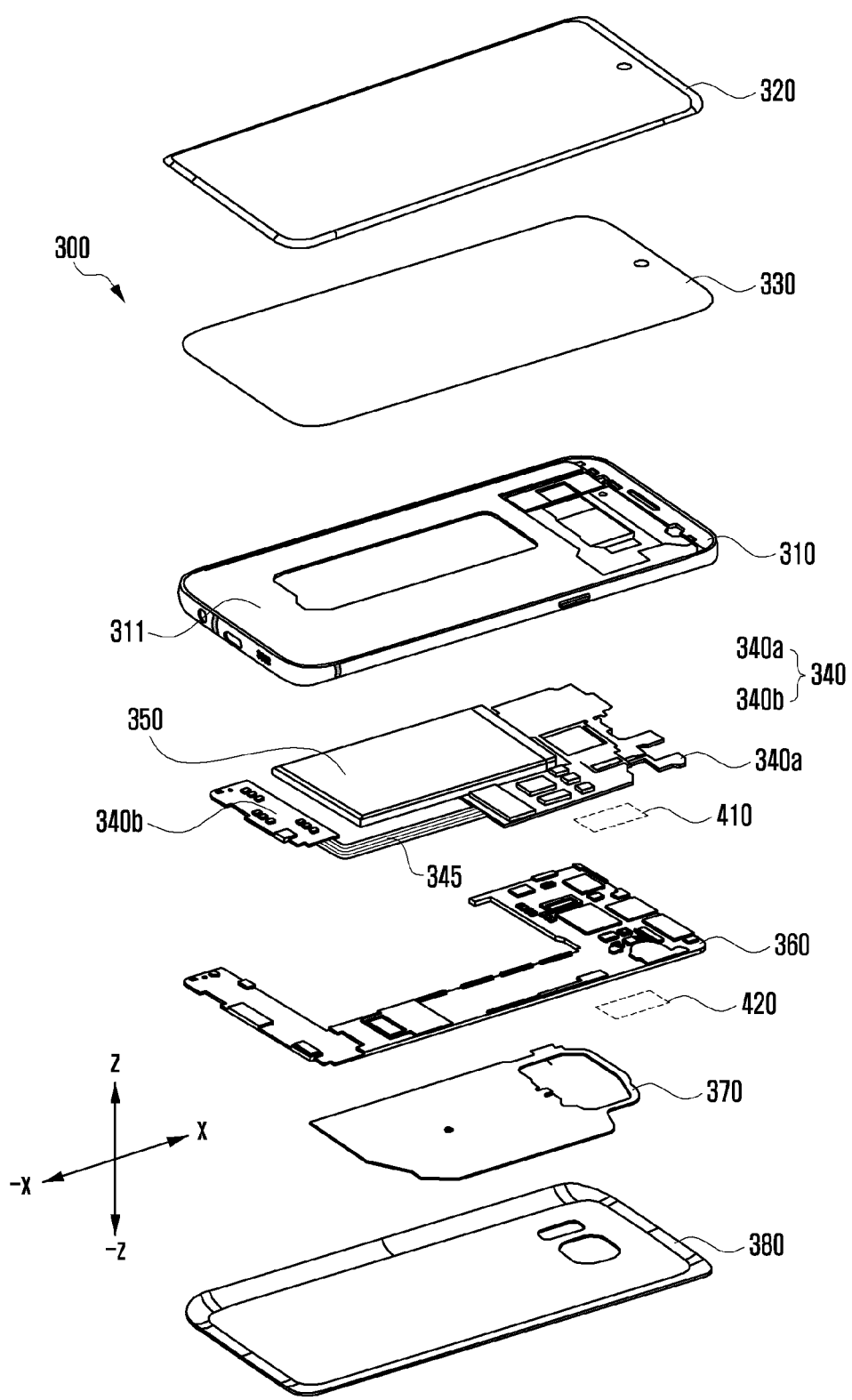
FIG. 3 is an exploded perspective view illustrating an electronic device according to various embodiments of the disclosure.

FIG. 3 is an exploded perspective view illustrating an electronic device according to various embodiments of the disclosure.

Referring to FIG. 3, the electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 101 or 200 of FIG. 1 to FIG. 2B, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof.

A processor, a memory, and/or an interface may be mounted on the printed circuit board 340. The processor may include, for example, one or more of a central processing device, an application processor, a graphic processing device, an image signal processor, a sensor hub processor, or a communication processor.

According to various embodiments, the printed circuit board (PCB) 340 may include a first PCB 340a and a second PCB 340b. For example, the first PCB 340a and the second PCB 340b may be disposed to be spaced apart from each other with the battery 350 interposed therebetween.

According to an embodiment, the first PCB 340a may be disposed on one side (e.g., in the positive x-axis direction) with respect to the battery 350. The second PCB 340b may be disposed on the other side (e.g., in the negative x-axis direction) with respect to the battery 350.

According to an embodiment, the first PCB 340a and the second PCB 340b may be electrically connected using a signal connection member 345 (e.g., a coaxial cable and/or an FPCB). The signal connection member 345 may include at least one. In another example, the PCB 340 may include a structure in which a plurality of PCBs are stacked. The PCB 340 may include an interposer structure. The PCB 340 may be implemented in the form of a flexible printed circuit board (FPCB) and/or a rigid printed circuit board (PCB).

The memory may include a volatile memory or a non-volatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is a device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

According to an embodiment, the second support member 360 (e.g., a rear case) may cover a rear surface (e.g., a second surface facing toward a second direction (the negative z-axis direction)) of the PCB 340 (e.g., the first PCB 340a and the second PCB 340b). The second support member 360 may be made of a non-metal material (e.g., a polymer).

According to an embodiment, a conductive member 410 may be disposed at least in part on the first surface (e.g., in the positive z-axis direction) of the second support member 360. An antenna pattern 420 (e.g., a conductive pattern) may be disposed on a second surface (e.g., in the negative z-axis direction) of the second support member 360. According to various embodiments, one or more antenna patterns 420 may be disposed on the second surface (e.g., in the negative z-axis direction) of the second support member 360. The number of conductive members 410 provided in the electronic device 300 may be the same as the number of antenna patterns 420.

According to an embodiment, the antenna pattern 420 may be electrically connected to the processor 120 and/or to the wireless communication module 192 shown in FIG. 1, thus operating as an antenna radiator. The wireless communication module 192 may include an analog-to-digital (ADC) converter to convert an analog signal that is received through the antenna pattern 420 into a digital signal.

Figure 4:
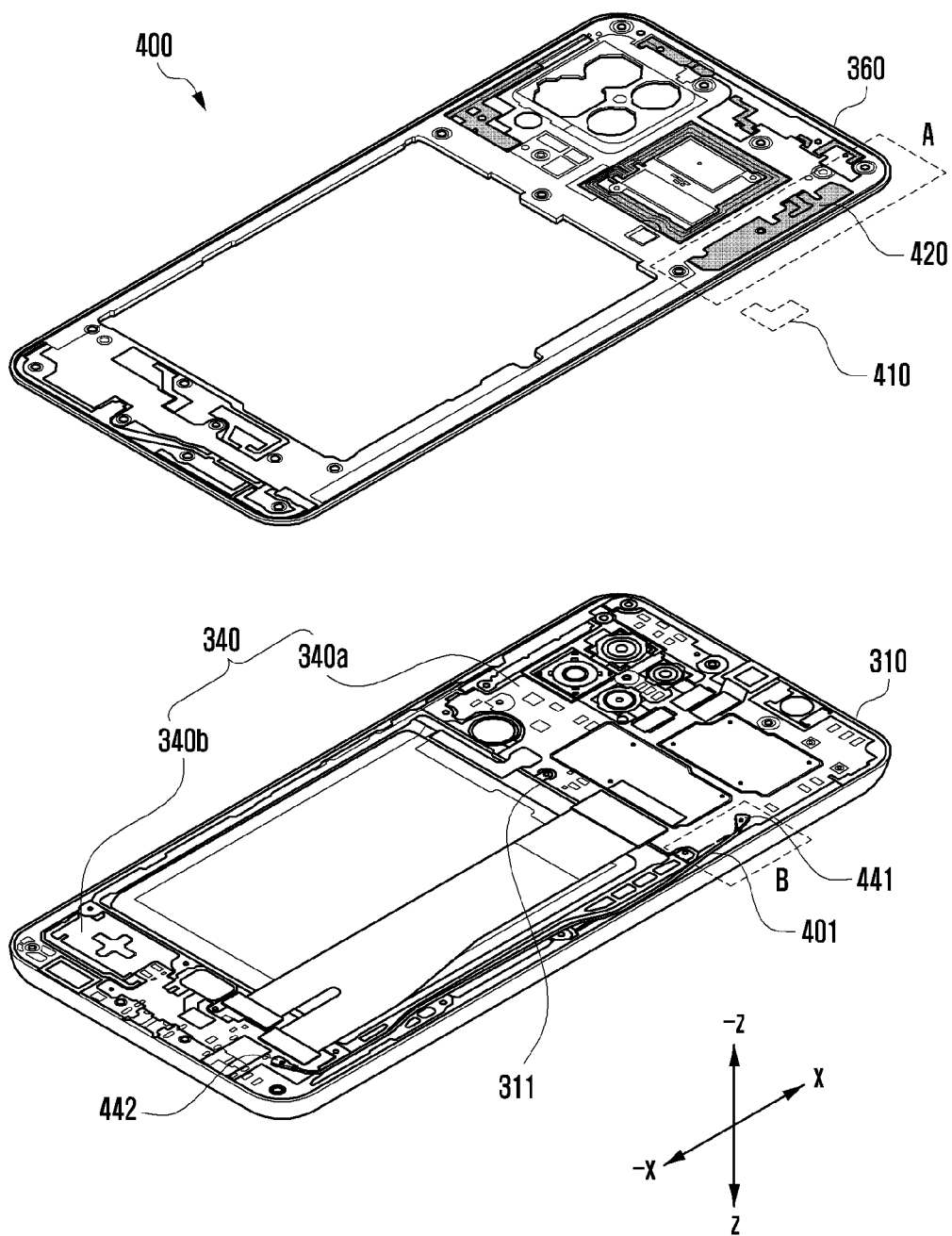
FIG. 4 is an exploded perspective view schematically illustrating a part of an electronic device according to various embodiments of the disclosure.
Figure 5:
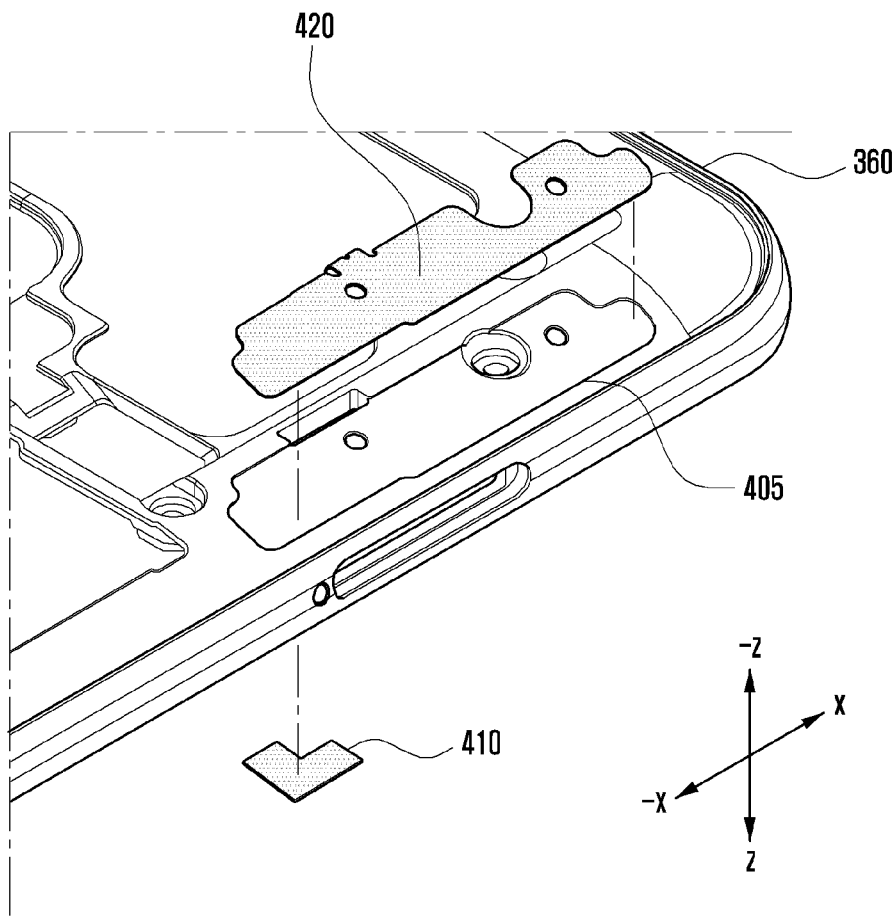
FIG. 5 is an enlarged view schematically illustrating a portion A of the electronic device shown in FIG. 4 according to various embodiments of the disclosure.

FIG. 4 is an exploded perspective view schematically illustrating a part of an electronic device according to various embodiments of the disclosure. FIG. 5 is an enlarged view schematically illustrating a portion A of the electronic device shown in FIG. 4 according to various embodiments of the disclosure.

According to an embodiment, an electronic device 400 of FIG. 4 shown in an exploded perspective view looked from one direction (e.g., the negative z-axis direction) corresponds to the second support member 360 and the housing 310 including the PCB 340 disposed on the second surface (e.g., in the negative z-axis direction) of the first support member 311 of the electronic device 300 shown in FIG. 3.

According to various embodiments, the electronic device 400 shown in FIG. 4 and subsequent drawings may include embodiments described in the electronic device 101 of FIG. 1, the electronic device 200 of FIGS. 2A and 2B, and/or the electronic device 300 of FIG. 3. In describing embodiments shown in FIG. 4 and subsequent drawings, the same reference numerals are assigned to components substantially the same as those of the embodiment of the electronic device 300 illustrated in FIG. 3, and duplicate descriptions may be omitted.

E In an embodiment, although embodiments related to the electronic device 400 shown in FIG. 4 and subsequent drawings will be described with respect to a bar-type electronic device, this is not construed as a limitation. The described embodiments may also be applied to any other electronic device such as a foldable type, a rollable type, a sliding type, a wearable type, tablet PC, or notebook PC.

With reference to FIGS. 4 and 5, the electronic device 400 according to various embodiments of the disclosure may include the housing 310, the printed circuit board (PCB) 340, and/or the second support member 360.

According to an embodiment, the housing 310 may include the first support member 311 disposed across the inside. The first support member 311 may be disposed inside the housing 310. The first support member 311 may be disposed inside the electronic device 400 and connected to or integrally formed with the housing 310. The first support member 311 may include, for example, a metal material and/or a non-metal (e.g., polymer) material. In an embodiment, the display 330 shown in FIG. 3 may be disposed on the first surface (e.g., in the z-axis direction) of the first support member 311.

According to an embodiment, the PCB 340 may be disposed on the second surface (e.g., in the negative z-axis direction) of the first support member 311. For example, the first surface (e.g., in the positive z-axis direction) of the PCB 340 may be disposed on the second surface (e.g., in the negative z-axis direction) of the first support member 311.

According to various embodiments, the PCB 340 may include the first PCB 340a and/or the second PCB 340b. The first PCB 340a and the second PCB 340b may be disposed to be spaced apart from each other. For example, the first PCB 340a may be disposed on one side of the battery 350 and the second PCB 340b may be disposed on another side of the battery 350, as shown in FIG. 3. For example, the first PCB 340a and the second PCB 340b may be arranged to oppose each other (e.g., two opposing sides in the positive x-axis direction and in the negative x-axis direction), and the battery 350 may be provided between the first PCB 340a and the second PCB 340b.

According to an embodiment, the first PCB 340a and the second PCB 340b may be electrically connected using a signal connection member 401 (e.g., a first signal connection member). The signal connection member 401 may include a coaxial cable. The first PCB 340a may include a first connector 441. The second PCB 340b may include a second connector 442. Each of the first and second connectors 441 and 442 may include a plug. Each of the first and second connectors 441 and 442 may include a conductive ground. Each of the first and second connectors 441 and 442 may be formed of a conductive material (e.g., metal). Although in the embodiment of FIG. 4 one signal connection member 401 (e.g., the first signal connection member) is described as an example, one or more signal connection members 401 may be included.

According to various embodiments, the first connector 441 may be disposed on the first PCB 340a in the form of a male connector. The second connector 442 may be disposed on the second PCB 340b in the form of a male connector. The signal connection member 401 may be configured to have a female connector at a first end and/or a second end thereof. The first connector 441 (e.g., male connector) and/or the second connector 442 (e.g., male connector) may be electrically coupled to the first end (e.g., female connector) and/or the second end (e.g., female connector) of the signal connection member 401, respectively.

According to various embodiments, the first end of the signal connection member 401 may be connected to the first connector 441 disposed on the first PCB 340a. The second end of the signal connection member 401 may be connected to the second connector 442 disposed on the second PCB 340b.

According to an embodiment, the second support member 360 (e.g., the rear case) may be disposed on the second surface (e.g., in the negative z-axis direction) of the PCB 340 (e.g., the first PCB 340a and the second PCB 340b). The second support member 360 may be made of a non-conductive material. The second support member 360 may be made of a non-metal material (e.g., polymer). The second support member 360 may include a dielectric structure.

According to an embodiment, the conductive member 410 (e.g., a first conductive member) may be disposed at least in part on the first surface (e.g., in the z-axis direction) of the second support member 360. The conductive member 410 may include a conductive tape or a conductive plate. The conductive member 410 may be a floating ground. The antenna pattern 420 (e.g., a first antenna pattern) may be disposed on the second surface (e.g., in the negative z-axis direction) of the second support member 360. The conductive member 410 may be disposed to overlap at least in part with the antenna pattern 420.

According to various embodiments, one or more antenna patterns 420 may be disposed on the second surface (e.g., in the negative z-axis direction) of the second support member 360. The number of conductive members 410 that are provided in the electronic device 400 may be the same as the number of antenna patterns 420. With reference to FIG. 5, the antenna pattern 420 may be disposed inside a mounting portion 405 formed on the second surface of the second support member 360. The antenna pattern 420 may be electrically connected to the processor 120 and/or the wireless communication module 192 shown in FIG. 1, thus operating as an antenna.

Part (a) of FIG. 6 is a diagram illustrating a portion of a first surface (e.g., an inward surface) of a second support member of an electronic device according to various embodiments of the disclosure. Part (b) of FIG. 6 is a diagram illustrating a portion of a second surface (e.g., an outward surface) of a second support member of an electronic device according to various embodiments of the disclosure. FIG. 7 is a diagram illustrating a portion of a first surface (e.g., an inward surface) of a second support member of an electronic device according to various embodiments of the disclosure.

According to various embodiments, parts (a) and (b) of FIG. 6, and FIG. 7 schematically illustrates, in enlarged views, the inward and outward surfaces of the portion A of the electronic device 400 shown in FIG. 4, for example.

With reference to part (a) of FIG. 6, the conductive member 410 of the electronic device 400 according to various embodiments of the disclosure may be disposed on the first surface (e.g., the inward surface) of the second support member 360. An extended portion 421 of the antenna pattern 420 may be disposed at least in part on the first surface (e.g., the inward surface) of the second support member 360. The extended portion 421 of the antenna pattern 420 may have a power feeder 423 (e.g., a power feeding pad). The power feeder 423 may be in contact with an antenna contact mounted on the PCB 340 and thereby electrically connected to the PCB 340. The conductive member 410 may be disposed to be spaced apart from the extended portion 421 of the antenna pattern 420. A non-conductive member 610 may be disposed on the extended portion 421 of the antenna pattern 420.

With reference to part (b) of FIG. 6, the antenna pattern 420 may be disposed at least in part on the second surface (e.g., the outward surface) of the second support member 360. The antenna pattern 420 may be disposed to overlap at least in part with the conductive member 410. The antenna pattern 420 and the conductive member 410 may not be electrically connected by means of the second support member 360 interposed therebetween.

According to various embodiments, although the conductive member 410 is depicted as having an L-shape in part (a) of FIG. 6, this is not construed as a limitation. It may alternatively have various other shapes such as a linear shape, a square shape, or a polygonal shape.

With reference to FIG. 7, the non-conductive member 610 may be disposed to cover the extended portion 421 of the antenna pattern 420 and the conductive member 410. In an embodiment, the non-conductive member 610 may include a double-sided tape. In another embodiment, the non-conductive member 610 may form a PCB and/or FPCB. In an embodiment, one surface of the second support member 360 adjacent to the non-conductive member 610 may have a convex portion 425. The convex portion 425 may be formed on one surface of the second support member 360 to be spaced apart from the non-conductive member 610 and protrude. The convex portion 425 may press the first connector 441 and/or the second connector 442.

Parts (a) and (b) of FIG. 8 are diagrams illustrating the movement of a first signal connection member disposed on a first PCB of an electronic device according to various embodiments of the disclosure. Parts (a) and (b) of FIG. 9 are diagrams illustrating a conductive member disposed at a position corresponding to a first connector of an electronic device according to various embodiments of the disclosure.

According to various embodiments, parts (a) and (b) of FIG. 8 are enlarged views schematically depicting the portion B of the electronic device 400 shown in FIG. 4.

With reference to part (a) of FIG. 8, the first connector 441 to which the first end of the signal connection member 401 is connected may be moved to a second position 820 (e.g., toward the right).

With reference to part (b) of FIG. 8, the first connector 441 to which the first end of the signal connection member 401 is connected may be moved to a first position 810 (e.g., toward the left).

According to various embodiments, as shown in FIG. 4, the signal connection member 401 may be connected to the first connector 441 at the first end thereof and connected to the second connector 442 at the second end thereof. For example, when the second end of the signal connecting member 401 is first connected to the second connector 442 and then the first end is connected to the first connector 441, the first connector 441 may be moved to the first position 810 or the second position 820 because of an extra length of the signal connection member 401.

According to various embodiments, when the first connector 441 is moved to the first position 810 or the second position 820, the antenna pattern 420 disposed on the second surface of the second support member 360 at a position corresponding to the first connector 441 may cause a deviation in the resonant frequency band.

With reference to FIG. 4 and parts (a) and (b) of FIG. 9, the conductive member 410 may be disposed on the first surface of the second support member 360. The conductive member 410 may be disposed between the first connector 441 and the antenna pattern 420.

According to an embodiment, the conductive member 410 may be disposed to cover the first position 810 and the second position 820 between which the first connector 441 may move, and may cover an area between the first position 810 and the second position 820 (or a movement path of the conductive member 410 between the first position 810 and the second position 820). The conductive member 410 may block parasitic resonance, which is changed as the first connector 441 moves to the first position 810 or the second position 820, from being transmitted to the antenna pattern 420. By disposing the conductive member 410 to cover the first and second positions 810 and 820 between which the first connector 441 may move, it is possible to reduce a deviation occurring in the resonant frequency band of the antenna pattern 420 and enlarge the area of the antenna pattern 420. In an embodiment, although it is described in parts (a) and (b) of FIG. 9 that the conductive member 410 (e.g., the first conductive member) is disposed to cover the first and second positions 810 and 820 between which the first connector 441 may move, a second conductive member may be additionally disposed to cover positions to which the second connector 442 may move. In this case, the second conductive member may be disposed to correspond at least in part to the second connector 442, and a second antenna pattern may be disposed on the second surface of the second support member 360 to correspond at least in part to the second conductive member.

According to various embodiments, a portion of the conductive member 410 may not cover a portion of the first connector 441 and/or the second connector 442. For example, a portion of the conductive member 410 may not cover a portion (e.g., a head of the connector) where the first connector 441 and/or the second connector 442 do not move, thereby improve the performance of the antenna pattern 420.

Parts (a) and (b) of FIG. 10 are diagrams schematically illustrating a configuration in which a conductive member of an electronic device is disposed between a first connector and an antenna pattern according to various embodiments of the disclosure.

With reference to parts (a) and (b) of FIG. 10, in the electronic device 400 according to various embodiments of the disclosure, the first surface of the PCB 340 (e.g., the first PCB 340a) may be disposed on the second surface (e.g., in the negative z-axis direction) of the first support member 311. The first connector 441 may be disposed on the second surface of the PCB 340. The conductive member 410 may be disposed on the first surface (e.g., in the positive z-axis direction) of the second support member 360 to correspond to at least a portion of the first connector 441. The conductive member 410 may be disposed to be spaced apart from the first connector 441. The antenna pattern 420 may be disposed on the second surface (e.g., in the negative z-axis direction) of the second support member 360 to correspond to at least a portion of the conductive member 410.

According to various embodiments, part (a) of FIG. 10 depicts a state in which the first connector 441 is moved to a first position (e.g., the first position 810 in FIG. 8). Part (b) of FIG. 10 depicts a state in which the first connector 441 is moved to a second position (e.g., the second position 820 in FIG. 8).

According to an embodiment, the conductive member 410 may be disposed on the first surface (e.g., in the z-axis direction) of the second support member 360 to cover the first position 810 and the second position 820 between which the first connector 441 may move. When the conductive member 410 is disposed to cover the first and second positions 810 and 820 of the first connector 441, a first electric field 1002 and/or a second electric field 1004 radiated from the antenna pattern 420 may not be transmitted toward the PCB 340. A third electric field 1010 of the antenna pattern 420 may be radiated toward the outside of the electronic device 400. In this case, the antenna pattern 420 may reduce a deviation occurring in the resonant frequency band and also reduce radiation performance degradation.

Table 1 below shows deviations in total radiated power (TRP) of an electronic device according to a comparative embodiment and the electronic device 400 according to various embodiments of the disclosure.

TABLE 1

| Frequency band | B7 | | | B38 | | | B41 | | |
|---|---|---|---|---|---|---|---|---|---|
| Range | Low | Mid. | High | Low | Mid. | High | Low | Mid. | High |
| Comparative | 1.67 dB | 2.13 dB | 1.96 dB | 1.72 dB | 1.34 dB | 1.81 dB | 1.83 dB | 1.10 dB | 4.03 dB |
| Disclosure | 0.11 dB | 0.12 dB | 0.09 dB | 0.07 dB | 0.16 dB | 0.30 dB | 0.20 dB | 0.29 dB | 0.26 dB |

In Table 1, the electronic device according to a comparative embodiment may be in a state in which the conductive member 410 is not disposed on the first surface of the second support member 360. In case of the comparative embodiment, when the first connector 441 is moved to the first position 810 or the second position 820, deviations of up to about 4 dB may occur in the frequency bands of B7 (e.g., about 2600 MHz to 2650 MHz), B38 (e.g., about 2560 MHz to 2600 MHz), and B41 (e.g., about 2500 MHz to 2560 MHz).

In Table 1, the electronic device 400 according to various embodiments of the disclosure may be in a state in which the conductive member 410 is disposed on the first surface of the second support member 360. In case of the electronic device 400 according to various embodiments of the disclosure, even if the first connector 441 is moved to the first position 810 or the second position 820, the deviations can be reduced to about 0.3 dB or less in the frequency bands of B7 (e.g., about 2600 MHz to 2650 MHz), B38 (e.g., about 2560 MHz to 2600 MHz), and B41 (e.g., about 2500 MHz to 2560 MHz).

FIG. 11 is an exploded perspective view schematically illustrating a portion of an electronic device according to various embodiments of the disclosure.

According to an embodiment, an electronic device 400 of FIG. 11 shown in an exploded perspective view looked from one direction (e.g., the negative z-axis direction) corresponds to the second support member 360 and the housing 310 including the PCB 340 disposed on the second surface (e.g., in the negative z-axis direction) of the first support member 311 of the electronic device 300 shown in FIG. 3.

According to various embodiments, the electronic device 400 shown in FIG. 11 and subsequent drawings may include embodiments described in the electronic device 400 of FIGS. 4 to 10. In describing embodiments shown in FIG. 11 and subsequent drawings, the same reference numerals are assigned to components substantially the same as those of the embodiment of the electronic device 400 illustrated in FIGS. 4 to 10, and duplicate descriptions may be omitted.

With reference to FIG. 11, the electronic device 400 according to various embodiments of the disclosure may include the housing 310, the printed circuit board (PCB) 340, and/or the second support member 360.

According to an embodiment, the display 330 shown in FIG. 3 may be disposed on the first surface (e.g., in the z-axis direction) of the first support member 311 integrally formed with the housing 310.

According to an embodiment, the PCB 340 may be disposed on the second surface (e.g., in the negative z-axis direction) of the first support member 311. The PCB 340 may include the first PCB 340a and the second PCB 340b disposed to be spaced apart from each other. The first PCB 340a and the second PCB 340b may be electrically connected using the first signal connection member 401 and a second signal connection member 1110. Each of the first and second signal connection members 401 and 1110 may include a coaxial cable. The first PCB 340a may include the first connector 441 and a third connector 1113. The second PCB 340b may include the second connector 442 and a fourth connector 1114. Each of the first, second, third, and fourth connectors 441, 442, 1113, and 114 may include a plug. Each of the first, second, third, and fourth connectors 441, 442, 1113, and 114 may include a conductive ground.

According to various embodiments, the first end of the first signal connection member 401 may be connected to the first connector 441 disposed on the first PCB 340a. The second end of the first signal connection member 401 may be connected to the second connector 442 disposed on the second PCB 340b. The first end of the second signal connection member 1110 may be connected to the third connector 1113 disposed on the first PCB 340a. The second end of the second signal connection member 1110 may be connected to the fourth connector 1114 disposed on the second PCB 340b.

According to an embodiment, the second support member 360 may be disposed on the second surface (e.g., in the negative z-axis direction) of the PCB 340 (e.g., the first PCB 340a and the second PCB 340b).

According to an embodiment, a first conductive member 410, a second conductive member 412, and/or a third conductive member 414 may be disposed on at least a part of the first surface (e.g., in the z-axis direction) of the second support member 360. Each of the first, second, and third conductive members 410, 412, and 414 may include a conductive tape or a conductive plate. Each of the first, second, and third conductive members 410, 412, and 414 may be a floating ground.

According to various embodiments, the first conductive member 410 and the second conductive member 412 may be disposed at positions facing the first PCB 340a. The third conductive member 414 may be disposed at a position facing the second PCB 340b.

According to an embodiment, a first antenna pattern 420 and a second antenna pattern 424 may be disposed at least in part on the second surface (e.g., in the negative z-axis direction) of the second support member 360. The first antenna pattern 420 may be disposed to overlap at least in part with the first and second conductive members 410 and 412. The second antenna pattern 424 may be disposed to overlap at least in part with the third conductive member 414.

According to various embodiments, a fourth conductive member 416 and a fifth conductive member 418 may be further disposed on the first surface (e.g., in the z-axis direction) of the second support member 360. A third antenna pattern 426 may be further disposed on the second surface (e.g., in the negative z-axis direction) of the second support member 360.

FIG. 12 is a diagram illustrating the movement of first and second signal connection members disposed on a first PCB of an electronic device according to various embodiments of the disclosure. FIG. 13 is a diagram illustrating first and second conductive members disposed respectively at positions corresponding to first and third connectors of an electronic device according to various embodiments of the disclosure.

According to various embodiments, FIG. 12 schematically illustrates, in an enlarged view, a portion C of the electronic device 400 shown in FIG. 11.

With reference to FIG. 12, the first connector 441 to which the first end of the first signal connection member 401 is connected may be moved to a first position 810 (e.g., toward the left) or a second position 820 (e.g., toward the right). The third connector 1113 to which the first end of the second signal connection member 1110 is connected may be moved to a third position 830 (e.g., toward the left) or a fourth position 840 (e.g., toward the right).

According to various embodiments, as shown in FIG. 11, the first signal connection member 401 may be connected to the first connector 441 at the first end thereof and connected to the second connector 442 at the second end thereof. The second signal connection member 1110 may be connected to the third connector 1113 at the first end thereof and connected to the fourth connector 1114 at the second end thereof. For example, when the second ends of the first and second signal connecting members 401 and 1110 are first connected to the second and fourth connectors 442 and 1114, respectively, and then the first ends of the first and second signal connecting members 401 and 1110 are respectively connected to the first and third connectors 441 and 1113, the first connector 441 may be moved to the first or second position 810 or 820 and the third connector 1113 may be moved to the third or fourth position 830 or 840 because of an extra length of each of the first and second signal connection members 401 and 1110.

According to various embodiments, when the first connector 441 is moved to the first position 810 or the second position 820, and when the third connector 1113 is moved to the third position 830 or the fourth position 840, the first antenna pattern 420 disposed on the second surface of the second support member 360 at positions corresponding to the first and third connectors 441 and 1113 may cause a deviation in the resonant frequency band.

With reference to FIGS. 11 and 13, the first and second conductive members 410 and 412 may be disposed to be spaced apart from each other on the first surface of the second support member 360. The first conductive member 410 may be disposed between the first connector 441 and the first antenna pattern 420. The second conductive member 412 may be disposed between the third connector 1113 and the first antenna pattern 420.

According to an embodiment, the first conductive member 410 may be disposed to cover the first position 810 and the second position 820 between which the first connector 441 may move. The second conductive member 412 may be disposed to cover the third position 830 and the fourth position 840 between which the third connector 1113 may move.

According to an embodiment, the first conductive member 410 may block parasitic resonance from being transmitted to the first antenna pattern 420 as the first connector 441 moves to the first position 810 or the second position 820. By disposing the first conductive member 410 to cover the first and second positions 810 and 820 between which the first connector 441 may move, it is possible to reduce a deviation occurring in the resonant frequency band of the first antenna pattern 420 and enlarge the area of the first antenna pattern 420.

According to an embodiment, the second conductive member 412 may block parasitic resonance from being transmitted to the first antenna pattern 420 as the third connector 1113 moves to the third position 830 or the fourth position 840. By disposing the second conductive member 412 to cover the third and fourth positions 830 and 840 between which the third connector 1113 may move, it is possible to reduce a deviation occurring in the resonant frequency band of the first antenna pattern 420 and enlarge the area of the first antenna pattern 420.

FIG. 14 is a diagram illustrating the movement of first and second signal connection members disposed on a second PCB of an electronic device according to various embodiments of the disclosure. FIG. 15 is a diagram illustrating a third conductive member disposed at a position corresponding to a second connector of an electronic device according to various embodiments of the disclosure.

According to various embodiments, FIG. 14 schematically illustrates, in an enlarged view, a portion D of the electronic device 400 shown in FIG. 11.

With reference to FIG. 14, the second connector 442 to which the second end of the first signal connection member 401 is connected may be moved to a fifth position 1410 (e.g., toward the left) or a sixth position 1420 (e.g., toward the right). In an embodiment, the fourth connector 1114 to which the second end of the second signal connection member 1110 is connected may not be moved.

According to various embodiments, when the second connector 442 is moved to the fifth position 1410 or the sixth position 1420, the second antenna pattern 424 disposed on the second surface of the second support member 360 at a position corresponding to the second connector 442 may cause a deviation in the resonant frequency band.

With reference to FIGS. 11 and 15, the third conductive member 414 may be disposed on the first surface of the second support member 360. The third conductive member 414 may be disposed between the second connector 442 and the second antenna pattern 424.

According to an embodiment, the third conductive member 414 may be disposed to cover the fifth position 1410 and the sixth position 1420 between which the second connector 442 may move.

According to an embodiment, the third conductive member 414 may block parasitic resonance from being transmitted to the second antenna pattern 424 as the second connector 442 moves to the fifth position 1410 or the sixth position 1420. By disposing the third conductive member 414 to cover the fifth and sixth positions 1410 and 1420 between which the second connector 442 may move, it is possible to reduce a deviation occurring in the resonant frequency band of the second antenna pattern 424 and enlarge the area of the second antenna pattern 424.

FIG. 16 is a diagram illustrating the movement of a third signal connection member disposed on a first PCB of an electronic device according to various embodiments of the disclosure. FIG. 17 is a diagram illustrating a fourth conductive member disposed at a position corresponding to a fifth connector of an electronic device according to various embodiments of the disclosure.

According to various embodiments, FIG. 16 schematically illustrates, in an enlarged view, a portion E of the electronic device 400 shown in FIG. 11.

With reference to FIG. 16, a fifth connector 1611 to which the first end of a third signal connection member 1610 is connected may be moved to a seventh position 1601 (e.g., toward the top) or an eighth position 1602 (e.g., toward the bottom).

According to various embodiments, when the fifth connector 1611 is moved to the seventh position 1601 or the eighth position 1602, the third antenna pattern 426 (see FIG. 11) disposed on the second surface of the second support member 360 at a position corresponding to the fifth connector 1611 may cause a deviation in the resonant frequency band.

With reference to FIGS. 11 and 17, the fourth conductive member 416 may be disposed on the first surface of the second support member 360. The fourth conductive member 416 may be disposed between the fifth connector 1611 and the third antenna pattern 426.

According to an embodiment, the fourth conductive member 416 may be disposed to cover the seventh position 1601 and the eighth position 1602 between which the fifth connector 1611 may move.

According to an embodiment, the fourth conductive member 416 may block parasitic resonance from being transmitted to the third antenna pattern 426 as the fifth connector 1611 moves to the seventh position 1601 or the eighth position 1602. By disposing the fourth conductive member 416 to cover the seventh and eighth positions 1601 and 1602 between which the fifth connector 1611 may move, it is possible to reduce a deviation occurring in the resonant frequency band of the third antenna pattern 426 and enlarge the area of the third antenna pattern 426.

FIG. 18 is a diagram illustrating the movement of a third signal connection member disposed on a second PCB of an electronic device according to various embodiments of the disclosure. FIG. 19 is a diagram illustrating a fifth conductive member disposed at a position corresponding to a sixth connector of an electronic device according to various embodiments of the disclosure.

According to various embodiments, FIG. 18 schematically illustrates, in an enlarged view, a portion F of the electronic device 400 shown in FIG. 11.

With reference to FIG. 18, a sixth connector 1612 to which the second end of the third signal connection member 1610 is connected may be moved to a ninth position 1603 (e.g., toward the left) or a tenth position 1604 (e.g., toward the right).

According to various embodiments, when the sixth connector 1612 is moved to the ninth position 1603 or the tenth position 1604, the second antenna pattern 424 disposed on the second surface of the second support member 360 at a position corresponding to the sixth connector 1612 may cause a deviation in the resonant frequency band.

With reference to FIGS. 11 and 19, the fifth conductive member 418 may be disposed on the first surface of the second support member 360. The fifth conductive member 418 may be disposed between the sixth connector 1612 and the second antenna pattern 424.

According to an embodiment, the fifth conductive member 418 may be disposed to cover the ninth position 1603 and the tenth position 1604 between which the sixth connector 1612 may move.

According to an embodiment, the fifth conductive member 418 may block parasitic resonance from being transmitted to the second antenna pattern 424 as the sixth connector 1612 moves to the ninth position 1603 or the tenth position 1604. By disposing the fifth conductive member 418 to cover the ninth and tenth positions 1603 and 1604 between which the sixth connector 1612 may move, it is possible to reduce a deviation occurring in the resonant frequency band of the second antenna pattern 424 and enlarge the area of the second antenna pattern 424.

FIG. 20 is a diagram illustrating the antenna resonance of an electronic device according to a comparative embodiment and the antenna resonance of an electronic device according to various embodiments of the disclosure.

For example, as shown in FIGS. 4 and 5, the electronic device 400 according to various embodiments of the disclosure may be in a state in which the conductive member 410 is disposed on the first surface (e.g., in the z-axis direction) of the second support member 360 to cover the first and second positions 810 and 820 between which the first connector 441 may move. The electronic device according to a comparative embodiment may be in a state in which the conductive member 410 is not disposed on the first surface of the second support member 360.

In a case in which the conductive member 410 is not disposed on the first surface of the second support member 360 as in the electronic device according to the comparative embodiment, when the first connector 441 moves to the first position 810 or the second position 820, a deviation may occur in the resonant frequency of the antenna pattern 420 by about 80 MHz to 90 MHz as indicated by graph P1 and graph P2, respectively. The graph P1 may represent a total radiation efficiency when the first connector 441 is located at the first position 810, and the graph P2 may represent a total radiation efficiency when the first connector 441 is located at the second position 820, in the case in which the conductive member 410 is not provided on the first surface of the second support member 360.

In a case in which the conductive member 410 is disposed on the first surface of the second support member 360 as in the electronic device 400 according to various embodiments of the disclosure, even if the first connector 441 moves to the first position 810 or the second position 820, a deviation is reduced while the resonance frequency of the antenna pattern 420 is lowered as indicated by graph G1 and graph G2. The graph G1 may represent a total radiation efficiency when the first connector 441 is located at the first position 810, and the graph G2 may represent a total radiation efficiency when the first connector 441 is located at the second position 820, in the case in which the conductive member 410 is provided on the first surface of the second support member 360.

FIG. 21 is a diagram illustrating the antenna performance deviation of an electronic device according to a comparative embodiment. FIG. 22 is a diagram illustrating the antenna performance deviation of an electronic device according to various embodiments of the disclosure.

For example, FIG. 21 shows an antenna performance deviation of the electronic device according to the comparative embodiment in a state where the conductive member 410 is not disposed on the first surface of the second support member 360.

In a case in which the conductive member 410 is not disposed on the first surface of the second support member 360 as in the electronic device according to the comparative embodiment, when the first connector 441 moves to the first position 810 or the second position 820, a deviation may occur in the resonant frequency band by about 100 MHz to 150 MHz as indicated by graph P3 and graph P4. The graph P3 may represent a total radiation efficiency when the first connector 441 is located at the first position 810, and the graph P4 may represent a total radiation efficiency when the first connector 441 is located at the second position 820, in the case in which the conductive member 410 is not provided on the first surface of the second support member 360.

For example, FIG. 22 shows an antenna performance deviation of the electronic device 400 according to various embodiments of the disclosure in a state where the conductive member 410 is disposed on the first surface of the second support member 360.

In a case in which the conductive member 410 is disposed on the first surface of the second support member 360 as in the electronic device 400 according to various embodiments of the disclosure, even if the first connector 441 moves to the first position 810 or the second position 820, a deviation is reduced in the resonance frequency band as indicated by graph G3 and graph G4. The graph G3 may represent a total radiation efficiency when the first connector 441 is located at the first position 810, and the graph G4 may represent a total radiation efficiency when the first connector 441 is located at the second position 820, in the case in which the conductive member 410 is provided on the first surface of the second support member 360.

According to various embodiments of the disclosure, an electronic device 300 or 400 may include a housing 310 including a first support member 311, a display 330 disposed on a first surface of the first support member 311, a first printed circuit board 340*a* and a second printed circuit board 340*b* disposed on a second surface of the first support member 311, a signal connection member 401 electrically connected at a first end thereof to a first connector 441 disposed on the first printed circuit board 340*a* and electrically connected at a second end thereof to a second connector 442 disposed on the second printed circuit board 340*b*, a second support member 360 disposed on a rear surface of the first printed circuit board 340*a*, a conductive member 410 disposed on a first surface of the second support member 360 at a position corresponding at least in part to the first connector 441, and an antenna pattern 420 disposed on a second surface of the second support member 360 at a position corresponding at least in part to the conductive member 410, wherein the conductive member 410 may be disposed to cover a first position 810 and a second position 820 between which the first connector 441 moves, and a portion of the conductive member 410 may be disposed so as not to cover a non-moving portion (e.g., a head of the first connect 441) of the first connector 441.

According to various embodiments, the first connector 441 and the second connector 442 may be made of a conductive material.

According to various embodiments, the second support member 360 may be made of a non-conductive material.

According to various embodiments, the signal connection member 401 may include a coaxial cable.

According to various embodiments, an extended portion 421 of the antenna pattern 420 may be disposed on the first surface of the second support member 360, and the conductive member 410 may be disposed to be spaced apart from the extended portion 421 of the antenna pattern 420.

According to various embodiments, the electronic device may further include a non-conductive member 610 disposed to cover the extended portion 421 of the antenna pattern 420 and the conductive member 410.

According to various embodiments, the non-conductive member 610 may be disposed to press the first connector 441.

According to various embodiments, the first connector 441 and the conductive member 410 may be disposed to be spaced apart from each other.

According to various embodiments, the electronic device 300 may further include an additional conductive member disposed to cover a first position 810 and a second position 820 between which the second connector 422 moves.

According to various embodiments, a portion of the additional conductive member may be disposed so as not to cover a non-moving portion (e.g., a head of the second connector 442) of the second connector 442.

According to various embodiments of the disclosure, an electronic device 300 or 400 may include a housing 310 including a first support member 311, a display 330 disposed on a first surface of the first support member 311, a first printed circuit board 340*a* and a second printed circuit board 340*b* disposed on a second surface of the first support member 311, a first signal connection member 401 electrically connected at a first end thereof to a first connector 441 disposed on the first printed circuit board 340*a* and electrically connected at a second end thereof to a second connector 442 disposed on the second printed circuit board 340b, a second signal connection member 1110 electrically connected at a first end thereof to a third connector 1113 disposed on the first printed circuit board 340a and electrically connected at a second end thereof to a fourth connector 1114 disposed on the second printed circuit board 340b, a second support member 360 disposed on a rear surface of the first printed circuit board 340a and/or the second printed circuit board 340b, a first conductive member 410 disposed on a first surface of the second support member 360 at a position corresponding at least in part to the first connector 441, and a second conductive member 412 disposed on the first surface of the second support member 360 at a position corresponding at least in part to the third connector 1113, and a first antenna pattern 360 disposed on a second surface of the second support member 360 at a position corresponding at least in part to the first and second conductive members 410 and 412.

According to various embodiments, the first connector 441, the second connector 442, the third connector 1113, and the fourth connector 1114 may be made of a conductive material.

According to various embodiments, the second support member 360 may be made of a non-conductive material.

According to various embodiments, each of the first and second signal connection members 401 and 1110 may include a coaxial cable.

According to various embodiments, the electronic device may further include a third conductive member 414 disposed on the first surface of the second support member 360 at a position corresponding at least in part to the second connector 442.

According to various embodiments, the electronic device may further include a second antenna pattern 424 disposed on the second surface of the second support member 360 at a position corresponding at least in part to the third conductive member 414.

According to various embodiments, the first conductive member 410 may be disposed to cover a first position 810 and a second position 820 between which the first connector 441 moves, the second conductive member 412 may be disposed to cover a third position 830 and a fourth position 840 between which the third connector 1113 moves, and the first and second conductive members 410 and 412 may be disposed to be spaced apart from each other.

According to various embodiments, the third conductive member 414 may be disposed to cover a fifth position 1410 and a sixth position 1420 between which the second connector 442 moves.

According to various embodiments, the electronic device may further include a third signal connection member 1610 electrically connected at a first end thereof to a fifth connector 1611 disposed on the first printed circuit board 340a and electrically connected at a second end thereof to a sixth connector 1612 disposed on the second printed circuit board 340b.

According to various embodiments, the electronic device may further include a fourth conductive member 416 disposed on the first surface of the second support member 360 at a position corresponding at least in part to the fifth connector 1611, and the fourth conductive member 416 may be disposed to cover a seventh position 1601 and an eighth position 1602 between which the fifth connector 1611 moves.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electronic device comprising:
    a housing comprising a first support member, the first support member comprising a first surface and a second surface that are disposed to oppose each other;
    a display disposed on the first surface of the first support member;
    a first printed circuit board and a second printed circuit board disposed on the second surface of the first support member;
    a signal connection member comprising a first end and a second end that are electrically connected to a first connector of the first printed circuit board and to a second connector of the second printed circuit board, respectively;
    a second support member disposed on a rear surface of the first printed circuit board;
    a conductive member disposed on a first surface of the second support member at a position corresponding to at least a part of the first connector; and
    an antenna pattern disposed on a second surface of the second support member at a position corresponding to at least a part of the conductive member,
    wherein the first connector is configured to move between a first position and a second position on the first printed circuit board, and the conductive member is disposed to cover the first position and the second position of the first printed circuit board, and a portion of the conductive member is disposed not to cover a non-moving portion of the first connector.

2. The electronic device of claim 1, wherein the first connector and the second connector are made of a conductive material.

3. The electronic device of claim 1, wherein the second support member is made of a non-conductive material.

4. The electronic device of claim 1, wherein the signal connection member comprises a coaxial cable.

5. The electronic device of claim 1, wherein an extended portion of the antenna pattern is disposed on the first surface of the second support member, and
    the conductive member is disposed to be spaced apart from the extended portion of the antenna pattern.

6. The electronic device of claim 5, further comprising:
    a non-conductive member disposed to cover the extended portion of the antenna pattern and the conductive member.

7. The electronic device of claim 6, wherein the non-conductive member is disposed to press the first connector.

8. The electronic device of claim 1, wherein the first connector and the conductive member are disposed to be spaced apart from each other.

9. The electronic device of claim 1,
    wherein the second connector is configured to move between a third position and a fourth position on the second printed circuit board, and the electronic device further comprises an additional conductive member disposed to cover the third position and the fourth position of the second printed circuit board.

10. The electronic device of claim 9, wherein a portion of the additional conductive member is disposed not to cover a non-moving portion of the second connector.

11. An electronic device comprising:
- a housing comprising a first support member, the first support member comprising a first surface and a second surface that are disposed to oppose each other;
- a display disposed on the first surface of the first support member;
- a first printed circuit board and a second printed circuit board disposed on the second surface of the first support member;
- a first signal connection member comprising a first end and a second end that are electrically connected to a first connector of the first printed circuit board and to a second connector of the second printed circuit board, respectively;
- a second signal connection member comprising a third end and a fourth end that are electrically connected to a third connector of the first printed circuit board and to a fourth connector of the second printed circuit board, respectively;
- a second support member disposed on a rear surface of the first printed circuit board or the second printed circuit board;
- a first conductive member disposed on a first surface of the second support member at a position corresponding to at least a part of the first connector, and a second conductive member disposed on the first surface of the second support member at a position corresponding to at least a part of the third connector; and
- a first antenna pattern disposed on a second surface of the second support member at a position corresponding to at least in part of the first conductive member and the second conductive member.

12. The electronic device of claim 11, wherein the first connector, the second connector, the third connector, and the fourth connector are made of a conductive material, and wherein the second support member is made of a non-conductive material.

13. The electronic device of claim 11, wherein each of the first signal connection member and the second signal connection member comprises a coaxial cable.

14. The electronic device of claim 11, further comprising:
a third conductive member disposed on the first surface of the second support member at a position corresponding to at least a part of the second connector.

15. The electronic device of claim 14, further comprising:
a second antenna pattern disposed on the second surface of the second support member at a position corresponding to at least part of the third conductive member.

16. The electronic device of claim 11, wherein the first connector is configured to move between a first position and a second position on the first printed circuit board, and the first conductive member is disposed to cover the first position and the second position of the first printed circuit board,
the second connector is configured to move between a third position and a fourth position on the second printed circuit board, and the second conductive member is disposed to cover the third position and the fourth position of the second printed circuit board, and
the first conductive member and the second conductive member are disposed to be spaced apart from each other.

17. The electronic device of claim 15, wherein the second connector is configured to move between a fifth position and a sixth position on the second printed circuit board, and the third conductive member is disposed to cover the fifth position and the sixth position of the second printed circuit board.

18. The electronic device of claim 11, further comprising:
a third signal connection member comprising a first end and a second end that are electrically connected to a fifth connector disposed on the first printed circuit board and to a sixth connector disposed on the second printed circuit board, respectively.

19. The electronic device of claim 18, further comprising:
a fourth conductive member disposed on the first surface of the second support member at a position corresponding to at least a part of the fifth connector,
wherein the fifth connector is configured to move between a seventh position and an eighth position on the first printed circuit board, and the fourth conductive member is disposed to cover the seventh position and the eighth position of the first printed circuit board.

20. An electronic device comprising:
- a printed circuit board comprising a connector that is movable between a first position and a second position on the printed circuit board;
- an antenna;
- a support member that is disposed between the printed circuit board and the antenna in a direction in which the printed circuit board, the support member, and the antenna are stacked;
- a signal connection member that is electrically connected to the connector of the printed circuit board; and
- a conductive member disposed between the printed circuit board and the support member, and aligned to cover the first position and the second position of the printed circuit board.

* * * * *